United States Patent
Simin et al.

(10) Patent No.: US 10,237,929 B2
(45) Date of Patent: Mar. 19, 2019

(54) SOLID-STATE LIGHTING SOURCE WITH INTEGRATED ELECTRONIC MODULATOR

(71) Applicant: Sensor Electronic Technology, Inc., Columbia, SC (US)

(72) Inventors: Grigory Simin, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/492,351

(22) Filed: Apr. 20, 2017

(65) Prior Publication Data

US 2017/0318632 A1  Nov. 2, 2017

Related U.S. Application Data

(60) Provisional application No. 62/328,013, filed on Apr. 27, 2016, provisional application No. 62/369,269, filed on Aug. 1, 2016.

(51) Int. Cl.
*H05B 33/08* (2006.01)
*H01L 25/16* (2006.01)
*H01L 33/60* (2010.01)

(52) U.S. Cl.
CPC ....... *H05B 33/0809* (2013.01); *H01L 25/167* (2013.01); *H01L 33/60* (2013.01); *H05B 33/0845* (2013.01)

(58) Field of Classification Search
None
See application file for complete search history.

(56) References Cited

U.S. PATENT DOCUMENTS

| 5,003,357 A | 3/1991 | Kim et al. |
| 7,252,408 B2 | 8/2007 | Mazzochette et al. |

(Continued)

FOREIGN PATENT DOCUMENTS

| JP | 2008047767 A | 2/2008 |
| JP | 2008507150 A | 3/2008 |

(Continued)

OTHER PUBLICATIONS

International Applcation No. PCT/KR2017/004417, International Search Report and Written Opinion, dated Aug. 8, 2017, 10 pages.

(Continued)

*Primary Examiner* — Telly Green
(74) *Attorney, Agent, or Firm* — LaBatt, LLC

(57) ABSTRACT

A solid-state light source (SSLS) with an integrated electronic modulator is described. A device can include a SSLS having an active p-n junction region is formed within the SSLS for electron-hole pair recombination and light emission. the active p-n junction region can include a n-type semiconductor layer, a p-type semiconductor layer and a light generating structure formed there between. A pair of current supply electrodes can be formed to receive a drive current from a current supply source that drives the SSLS. A field-effect transistor (FET) modulator can be monolithically integrated with the SSLS for modulation thereof. The FET modulator can receive a modulation voltage from a modulation voltage source. The modulation voltage includes voltage pulses having a pulse amplitude and polarity to turn on and off current flowing through the FET modulator. These voltage pulses enable the FET modulator to control the drive current supplied to the SSLS.

20 Claims, 16 Drawing Sheets

(56) References Cited

U.S. PATENT DOCUMENTS

| | | |
|---|---|---|
| 2017/0077085 A1 | 3/2017 | Simin et al. |
| 2017/0079102 A1 | 3/2017 | Simin et al. |
| 2017/0196061 A1 | 7/2017 | Simin et al. |
| 2017/0251533 A1 | 8/2017 | Shur et al. |

FOREIGN PATENT DOCUMENTS

| | | |
|---|---|---|
| JP | 2008198731 A | 8/2008 |
| KR | 10-2014-0046372 A | 4/2014 |

OTHER PUBLICATIONS

Chen, A., et al., "Broadband Optical Modulators: Science, Technology, and Applications," Copyright 2012, 1st Edition, ISBN-10: 1439825068, ISBN-13: 978-1439825068, CRC Press, Description and Table of Contents accessed Apr. 20, 2017, 6 pages.

Winder, S., "Light Emitting Diode Drivers and Control," 2011, 20 pages, vol. 20, No. 2, International Journal of High Speed Electronics and Systems, World Scientific Publishing Company, DOI: 10.1142/S0129156411006593.

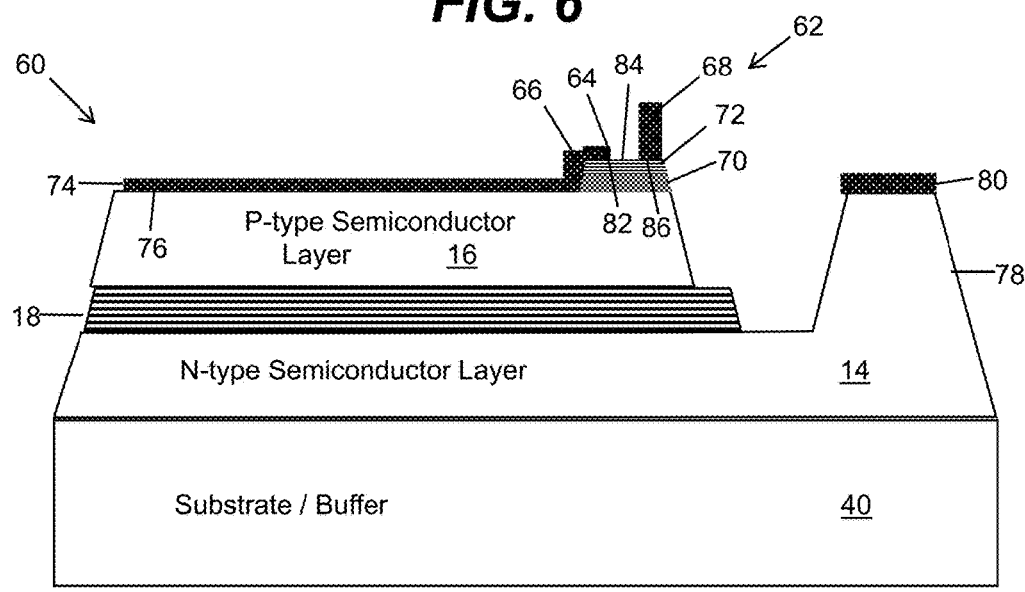
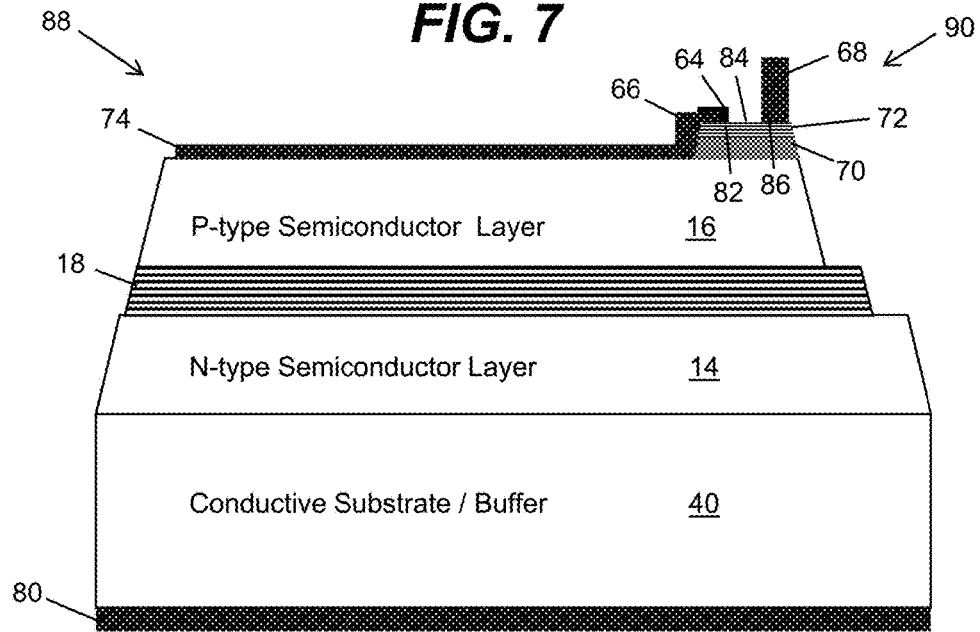

SOLID-STATE LIGHTING SOURCE WITH INTEGRATED ELECTRONIC MODULATOR

REFERENCE TO RELATED APPLICATIONS

The present patent application claims the benefit of U.S. Provisional Application No. 62/328,013, which was filed on 27 Apr. 2016, and U.S. Provisional Application No. 62/369,269, which was filed on 1 Aug. 2016, both of which are hereby incorporated by reference.

TECHNICAL FIELD

The present invention relates generally to solid-state lighting, and more particularly, to a solid-state lighting source (SSLS), such as a light emitting diode (LED) or a laser, with an integrated electronic modulator.

BACKGROUND ART

A great deal of interest has been focused on SSLSs, such as LEDs and lasers, and in particular, those that emit light in the blue and deep ultraviolet (UV) wavelengths. These devices are capable of being incorporated into various applications, including solid-state lighting, biochemical detection, high-density data storage, and the like.

A modern SSLS, such as an LED, typically includes three major components: an electron supply layer (e.g., a n-type semiconductor layer), a hole supply layer (e.g., a p-type semiconductor layer), and a light generating structure formed between the electron supply layer and the hole supply layer. Nitride-based SSLSs typically operate at a high current density level in order to achieve high optical output. However, high current flowing through a SSLS can create significant self-heating issues and reliability degradation. This can be a problem in applications such as in optical communications, medicine, etc., that deploy high-powered SSLS devices that operate in a short-pulse modulated mode.

To address self-heating issues and reliability degradation of SSLS devices that operate in a short-pulse modulated mode, approaches have been deployed that rely on using external modulators. One type of external modulator is an external current modulator that can be connected to the SSLS device using wiring or similar methods. In general, the external current modulator can modulate the SSLS optical power of the device via a pumping current. Another external modulator is an external optical modulator that can be used to modulate beams of light generated from the SSLS device. Both of these external modulators have significant limitations. For example, using external driver circuits such as external current modulators and optical modulators result in parasitic parameters that limit modulation time and cause ringing and optical pulse distortions. The external driver circuits also result in a larger weight and cost for any systems that deploy SSLS devices. For example, the use of external optical modulators in SSLS systems can lead to additional optical loss and power consumption, as well as significantly increase the overall size, weight and cost of the systems.

SUMMARY OF THE INVENTION

This summary of the invention introduces a selection of certain concepts in a brief form that are further described below in the detailed description of the invention. It is not intended to exclusively identify key features or essential features of the claimed subject matter set forth in the claims, nor is it intended as an aid in determining the scope of the claimed subject matter.

Aspects of the present invention are directed to improving performance of high powered SSLS devices that operate in a short-pulse modulated mode in order to obviate one or more of the shortcomings associated with using external modulators. In particular, the various embodiments of the present invention disclose a SSLS device with a built-in or integrated electronic current modulator that includes electrodes for connection with a current supply source and a modulation voltage source. In one embodiment, the integrated electronic current modulator can include a field-effect transistor (FET) that receives a modulation voltage from the modulation voltage source that can include a pulse driver circuit. The modulation voltage can include voltage pulses having a pulse amplitude and polarity to turn on and off current flowing through the FET. These voltage pulses allow the FET to control a drive current supplied to the SSLS from the current supply source. With this configuration, parasitic parameters and interconnects are eliminated, enabling fast and efficient light modulation of the SSLS.

In one embodiment, a SSLS device can include a SSLS having an active p-n junction region is formed within the SSLS for electron-hole pair recombination and light emission. The active p-n junction region can include a n-type semiconductor layer, a p-type semiconductor layer and a light generating structure formed there between. A pair of current supply electrodes can be formed over the active p-n junction region. A SSLS access region can be formed within the SSLS to provide access to the active p-n junction region. A FET can be integrated in the SSLS access region between the active p-n junction region and one of the current supply electrodes. One of the electrodes of the FET, such as the gate electrode, can include at least one electrode connected to the modulation voltage source. The voltage pulses from the modulation voltage source turn on and off current that flows through the FET. This enables the FET to have the drive current supplied to the current supply electrodes from the current supply source as a function of the modulated voltage pulses. In this manner, short voltage pulses of high current amplitude can be delivered to the SSLS which results in fast and efficient light modulation.

A first aspect of the invention provides a device, comprising: a solid-state lighting source (SSLS) including an active p-n junction region for electron-hole pair recombination and light emission therefrom, the active p-n junction region including: a n-type semiconductor layer; a p-type semiconductor layer; and a light generating structure formed between the n-type semiconductor layer and the p-type semiconductor layer; a pair of current supply electrodes, wherein one of the current supply electrodes is formed over the p-type semiconductor layer and another of the current supply electrodes is formed over the n-type semiconductor layer; a SSLS access region formed within the SSLS that provides access to the active p-n junction region; a field-effect transistor (FET) modulator having a drain region, a gate electrode, and a source electrode integrated in the SSLS access region between the active p-n junction region and one of the current supply electrodes; and a modulation voltage source to supply a modulation voltage to the FET modulator.

A second aspect of the invention provides a device, comprising: a solid-state lighting source (SSLS) including an active p-n junction region for electron-hole pair recombination and light emission therefrom, the active p-n junction region including: a n-type semiconductor layer; a p-type semiconductor layer; and a light generating structure formed between the n-type semiconductor layer and the p-type semiconductor layer; a pair of current supply electrodes, wherein one of the current supply electrodes is formed over the p-type semiconductor layer and another of the current supply electrodes is formed over the n-type semiconductor layer; a field-effect transistor (FET) modulator having a drain region, a gate electrode, and a source electrode formed over a top semiconductor layer of the SSLS; and a modulation voltage source to supply a modulation voltage to the FET modulator, wherein the modulation voltage source supplies voltage pulses to the gate electrode, the voltage pulses having a pulse amplitude and polarity to turn on and off current flowing through the FET modulator.

A third aspect of the invention provides a device, comprising: a solid-state light source (SSLS) structure including an array of SSLSs, each of the SSLSs including an active p-n junction region for electron-hole pair recombination and light emission therefrom, the active p-n junction region including: a n-type semiconductor layer; a p-type semiconductor layer; and a light generating structure formed between the n-type semiconductor layer and the p-type semiconductor layer, and an integrated field-effect transistor (FET) modulator that modulates the SSLS; and a pulse driver integrated with the SSLS structure to control modulation of the array of SSLSs in the SSLS structure with the corresponding FET modulators.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

FIG. 6 shows a cross sectional schematic view of a SSLS with a monolithically integrated FET modulator formed over a p-type semiconductor layer and a light generating structure according to an embodiment.

FIG. 7 shows a cross sectional schematic view of a SSLS formed on a substrate with a monolithically integrated FET modulator formed over a p-type semiconductor layer and a light generating structure of the SSLS according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
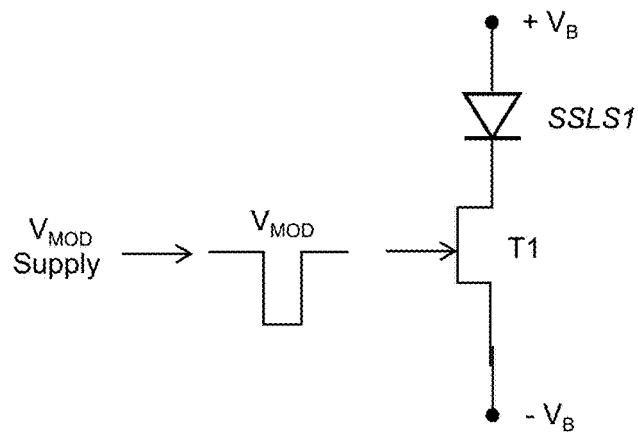
FIG. 1 shows a schematic circuit diagram of a SSLS monolithically integrated with a FET modulator according to an embodiment.

The various embodiments are directed to improving performance of high powered SSLS devices that operate in a short-pulse modulated mode with integrated current modulators. In one embodiment, a FET can be monolithically integrated with a SSLS to enable fast and efficient light modulation. The FET can receive a modulation voltage from a modulation voltage source in the form of voltage pulses having a pulse amplitude and polarity configured to turn on and off current flowing through the FET. These voltage pulses allow the FET to control a drive current supplied to the SSLS from a current supply source. This implementation eliminates parasitic parameters and interconnects that typically result from the use of external modulators. In another embodiment, a system can be formed from a SSLS structure having an array of SSLSs and a set of FET modulators, with each FET modulator monolithically integrated with one of the SSLSs. Other embodiments can include methods of fabricating devices and systems that include the SSLSs and the FET modulators.

As used herein, a SSLS includes any diode that, under normal operating conditions, operates in a forward-bias mode. The SSLS can include of a multitude of SSLSs such as for example, a p-n junction SSLS, a multiple-quantum well SSLS and a heterojunction SSLS. In one embodiment, the SSLS can include any type of semiconductor LED such as conventional and super luminescent LEDs, light emitting solid state lasers, laser diodes of various types, and/or the like. These examples of SSLSs can be configured to emit electromagnetic radiation from a light generating structure such as an active region upon application of a bias. The electromagnetic radiation emitted by these SSLSs can comprise a peak wavelength within any range of wavelengths, including visible light, ultraviolet radiation, deep ultraviolet radiation, infrared light, and/or the like. For example, these SSLSs can emit radiation having a dominant wavelength within the ultraviolet range of wavelengths. As an illustration, the dominant wavelength can be within a range of wavelengths of approximately 210 nanometers (nm) to approximately 350 nm.

Any of the various layers that form the SSLSs can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the SSLS (e.g., peak emission wavelength +/−five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the SSLS can be considered to be reflective when the layer reflects at least a portion of the relevant electromagnetic radiation (e.g., light having wavelengths close to the peak emission of the light generating structure). As used herein, a layer is partially reflective to radiation if it can reflect at least approximately five percent of the radiation, while a layer can also be considered to be partially reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

As mentioned above, aspects of the present invention are directed to improving performance of high powered SSLS devices that operate in a short-pulse modulated mode. As used herein, a high powered SSLS device that operates in a short-pulse modulated mode means that the intensity of the emitted light can change as a function of time from high to low (e.g., zero) intensity, where a maximum to minimum intensity ratio is at least 200% and a duration of the pulse can be as short as few nanoseconds. The main challenge in obtaining fast modulation of these high-power SSLS devices exists in delivering short-pulses of high current amplitude to the terminals of the SSLS devices. For example, at high levels of both instantaneous rates of voltage change over time (dV/dt) and instantaneous rates of current change over time (dI/dt) lead to parasitic interconnects that can create severe pulse shape distortions, ringing and instabilities in the SSLS devices. The inventors of the various embodiments described herein have determined that it is much more efficient for short-pulse operation to have the output stage (i.e., the terminal that provides an amplified power) of a current modulator connected to a SSLS with no parasitic interconnects. The solution to eliminating the parasitic interconnects as set forth herein is achieved by monolithically integrating the SSLS with the output stage of the modulator. As a result, input pulses that feed the modulator output stage can have much lower amplitudes that do not create significant distortions.

Turning to the drawings, FIG. 1 shows a schematic circuit diagram of a SSLS monolithically integrated with a FET modulator according to an embodiment. As shown in FIG. 1, SSLS1 is connected in series to FET T1, which is configured to receive a modulation voltage $V_{MOD}$ from a modulation voltage source. In particular, the modulation voltage source delivers the modulation voltage $V_{MOD}$ to the gate of FET T1. The modulation voltage $V_{MOD}$ includes voltage pulses having a pulse amplitude and polarity configured to turn on and off current flowing through the FET T1 as a result of its serial connection with SSLS1. As shown in FIG. 1, the cathode of SSLS1 is connected to the source of the FET T1, while the anode of SSLS1 and the drain of FET T1 are connected to the positive and negative terminals, respectively, of a voltage supply $V_B$.

In the embodiment, the modulation voltage pulses allow the FET T1 to control a drive current supplied to the SSLS1 from a voltage supply source. For example, in operation, the short-voltage pulses of the modulation voltage $V_{MOD}$ that turn on and off the FET T1, enable a fast and efficient light modulation of SSLS1 with drive current obtained from the voltage supply $V_B$. Since FET T1 is integrated with SSLS1 there are no parasitic interconnects, which allows this configuration to obviate severe pulse shape distortions, ringing and instabilities. While a voltage supply source is shown, it is understood that a current supply source can be used instead of the voltage supply source when desired.

In one embodiment, the short-voltage pulses of the modulation voltage $V_{MOD}$ can be configured to attain various operating characteristics of the SSLS1. For example, the voltage pulses of the modulation voltage $V_{MOD}$ can have a duration that is at least two times smaller than the thermal time constant of the SSLS1. Voltage pulses with such a duration in relation to the thermal time constant of SSLS1 are beneficial in that such operation reduces a likelihood of the SSLS1 overheating.

In another embodiment, the voltage pulses of the modulation voltage $V_{MOD}$ can be configured to have a duration and current amplitude that results in an overall device junction temperature that is less than the typical junction temperature of SSLS1 that is operated in a continuous mode at a nominal current selected for typical operation of the device. For example, the voltage pulses of the modulation voltage $V_{MOD}$ can have a duration of few nanoseconds or as long as several microseconds, and a voltage amplitude on the order of tenth of a volt and up to a volt. Such operation can attain an overall device junction temperature that is a fraction of a junction temperature when the SSLS1 is operated in a continuous wave (CW) mode. The overall junction temperature for a pulsed LED device can be estimated by comparing the average dissipated power in a pulsed mode and power in a CW mode. As a quick estimate, for a pulsed mode time of $\tau_{ps}$ and a periodicity of the pulses of TT, the estimated junction temperature, $T_{PS}$, can be on the order of $T_{PS}=T_{CM}(\tau_{ps}/TT)$. Having voltage pulses with such a duration and current amplitude that results in an overall device junction temperature of SSLS1 that is less than its typical junction temperature is beneficial in that SSLS1 can lead to a device lifetime of at least 100 hours.

Figure 2:
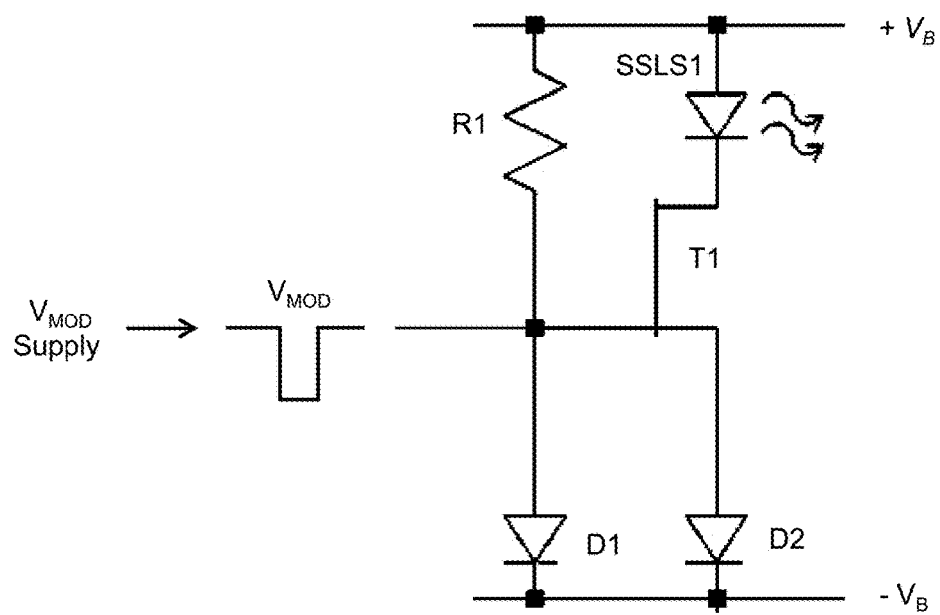
FIG. 2 shows a schematic circuit diagram of a SSLS monolithically integrated with a FET modulator and other electrical components according to an embodiment.

FIG. 2 shows a schematic circuit diagram of another embodiment in which a SSLS is monolithically integrated with a FET and other electrical components to set a desired operating point for the SSLS and the FET. In the embodiment depicted in FIG. 2, the SSLS1 is connected in series to FET T1. In addition, FIG. 2 shows the gate and source of FET T1 can be connected to the anodes of diodes D1 and D2, which are in parallel with each other and coupled to the negative terminal of the voltage supply $V_B$. Also, as shown in FIG. 2, resistor R1 can be coupled in series with the diode D1 through its anode, and coupled to the anode of the diode D2 through the gate and source of FET T1. FIG. 2 further shows the drain of the FET T1 connected to the cathode of SSLS1, which has its anode coupled to a node of the positive terminal of the voltage supply $V_B$ shared also by resistor R1. The modulation voltage source delivers the modulation voltage $V_{MOD}$ to the gate and drain of FET T1. The modulation voltage $V_{MOD}$ includes voltage pulses having a pulse amplitude and polarity configured to turn on and off current flowing through the FET T1 as a result of its serial connection with SSLS1.

In this configuration, the modulation voltage pulses $V_{MOD}$ are delivered to the FET T1 and the diodes D1 and D2. In this manner, the FET T1 and the diodes D1 and D2 can control the drive current supplied to the SSLS1. For example, in operation, the short-voltage pulses of the modulation voltage $V_{MOD}$ that turn on and off the FET T1 and the diodes D1 and D2, enable a fast and efficient light modulation of SSLS1 with drive current obtained from the voltage supply $V_B$. Similar to FIG. 1, the embodiment of FIG. 2 is without parasitic interconnects due to the integration of the FET T1, the diodes D1 and D2 and resistor R1 with the SSLS1, thus precluding severe pulse shape distortions, ringing and instabilities.

It is understood that the embodiment of FIG. 2 depicts one approach to achieving an optimal operating point that facilitates matching the stage input of a current modulator with a SSLS with the use of additional electronic components. Other variations of electronic components configured with the FET T1 and SSLS1 for setting an operating point are considered within the scope of this embodiment. For example, additional diodes can be connected in parallel with the diodes D1 and D2 and connected to the gate and drain of the FET T1.

Figure 3:
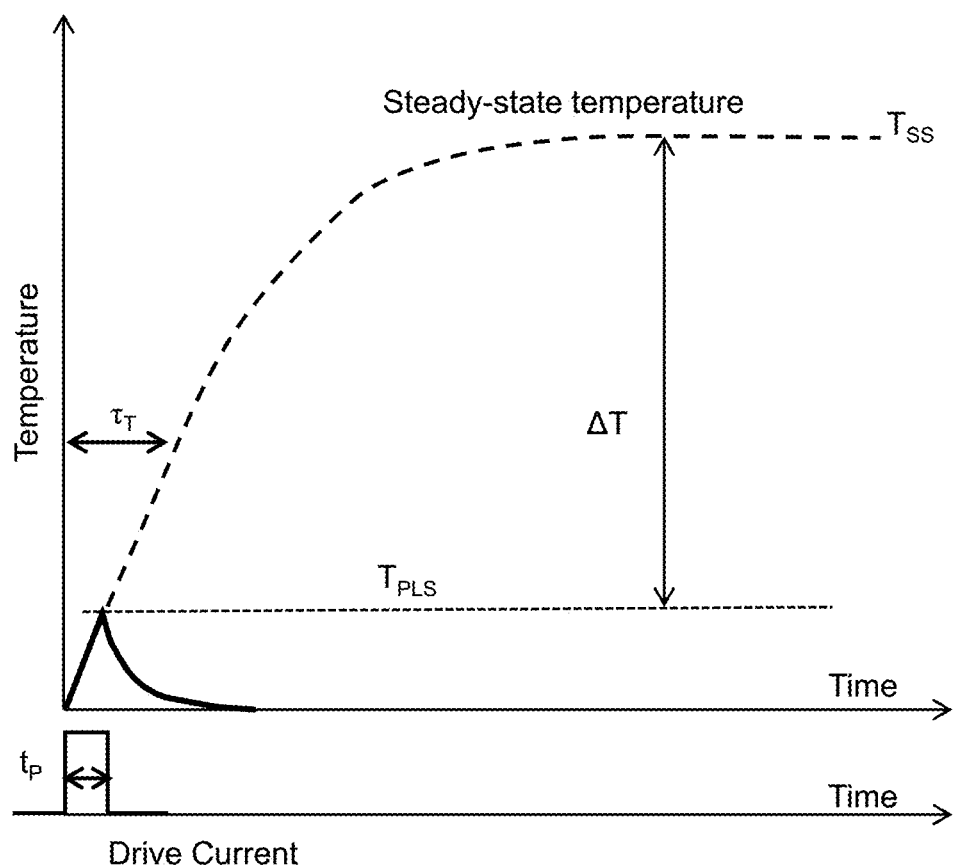
FIG. 3 is a graphical representation showing time-temperature dependencies of a SSLS operating in a continuous wave (CW) mode or under long-pulse driving conditions in comparison to a SSLS operating with short-pulse modulation.

FIG. 3 is a graphical representation showing time-temperature dependencies of a SSLS operating in a continuous wave (CW) mode or under long pulse driving conditions in comparison to a SSLS operating with short pulse modulation. In particular, FIG. 3 illustrates how short-pulse modulation achieves significantly higher optical output compared to a CW mode or long-pulse operation. During the operation of a SSLS, when a pumping current is applied to the device, self-heating takes place causing the device temperature to increase. As shown in FIG. 3, the device temperature of the SSLS will increase to a steady-state value $T_{SS}$. When the pumping current is applied to a SSLS, device self-heating takes place causing the device temperature to increase up to a steady-state value $T_{SS}$. Generally, the steady-state value $T_{SS}$ will depend on the thermal resistance of the SSLS as well as the thermal resistance of the mounting and the packaging of the SSLS device. The characteristic time for the self-heating of the SSLS, which is depicted in FIG. 3 as $\tau_T$, depends on the SSLS layer structure area as well as the mounting and packaging parameters of the device. In various SSLS implementations, the $\tau_T$ value can range typically from a few microseconds up to several milliseconds. If the current pulse is shorter than $\tau_T$, such as that shown in FIG. 3, then the SSLS temperature during the pulse increases approximately linearly as a function of time.

At the end of a short-current pulse with a pulse duration $t_P \ll \tau_T$, the SSLS temperature is approximately equal to $T_P = 0.63 \times T_{SS} \times (t_P/\tau_T)$. For example, if the pulse duration is only one-tenth of the $\tau T$ value, then the maximum device temperature due to self-heating effect will be only 0.063 of the steady-state temperature. In this manner, the time between pulses will be sufficient such that there is no substantial increase in the junction temperature of the device. FIG. 3 also depicts the parameters $T_{PLS}$ and $\Delta T$, which are a maximum temperature achieved by the SSLS operating in a pulsed mode and a difference between the temperatures of the diode operating in CW mode and a maximum temperature of SSLS operating in the pulsed mode, respectively. In the example shown in FIG. 3, the drive current acts for a duration $t_P \ll \tau_T$, which results in UV LED heating only up to temperature $T_{PSL}$, followed by subsequent cooling of the UV LED while the drive current is off.

In general, FIG. 3 indicates that SSLSs that operate in a short-pulse mode can have internal on/off switching times that are much faster in relation to SSLSs that operate in a CW mode or long-pulse operation. For example, group III-nitride based transistors can have internal on/off switching times that can range from several picoseconds to several nanoseconds. Monolithically integrating a FET with a SSLS that operates in a short-pulse mode can attain pulses having a duration that is much shorter than $\tau_T$, due to the absence of parasitic parameters, enabling the SSLS to have faster and more efficient light modulation.

Figure 4A:
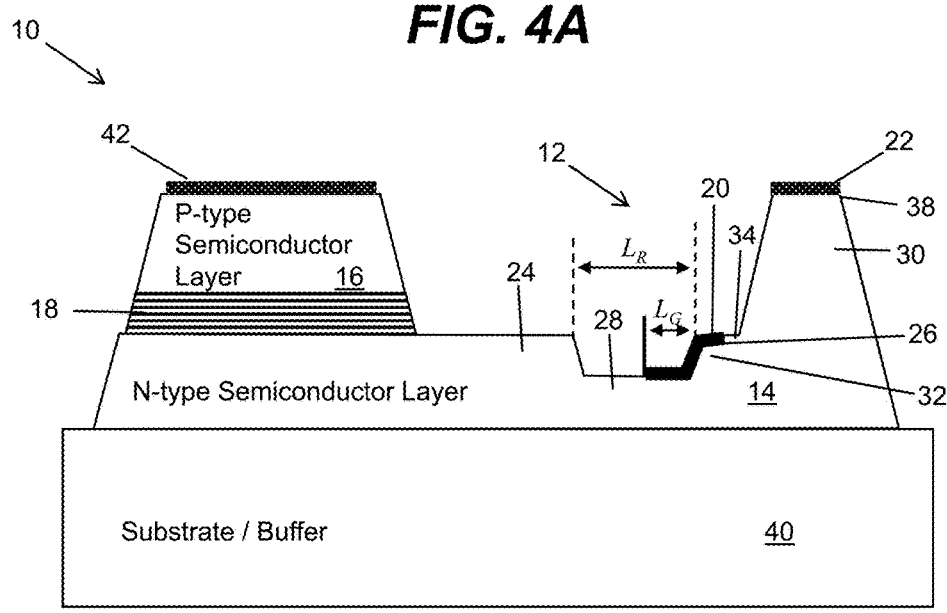
FIGS. 4A-4B show side and top schematic views of a SSLS with a monolithically integrated FET modulator according to one embodiment.
Figure 4B:
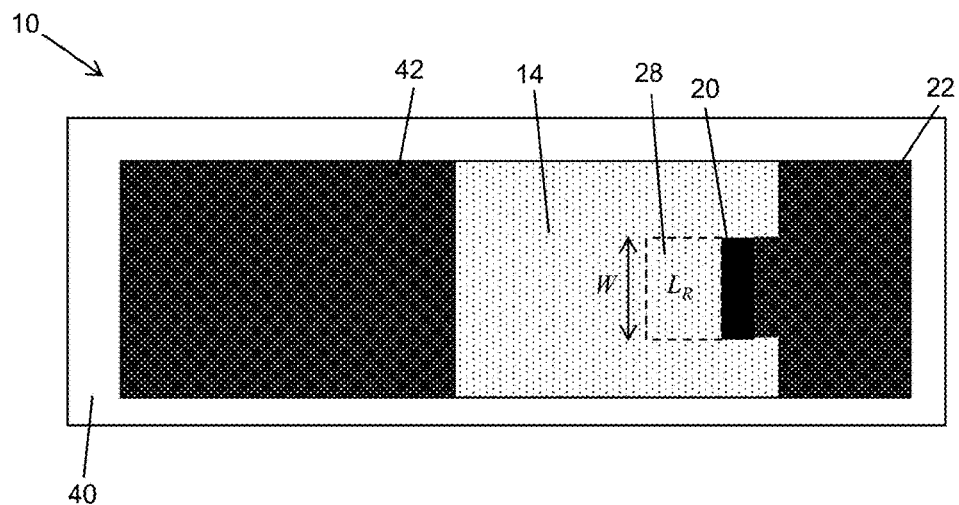

FIGS. 4A-4B show side and top schematic views of a SSLS 10 with a monolithically integrated FET modulator 12 according to one embodiment. As shown in the cross-sectional view of FIG. 4A, the SSLS 10 can include a n-type semiconductor layer 14 (e.g., an electron supply layer), a p-type semiconductor layer 16 (e.g., a hole supply layer) and a light generating structure 18 (e.g. a multi-quantum well) formed between the n-type semiconductor layer and the p-type semiconductor layer. In one embodiment, the n-type semiconductor layer 14, the p-type semiconductor layer 16 and the light generating structure 18 can form a heterostructure having an active p-n junction region within the SSLS 10 for electron-hole pair recombination and light emission.

In one embodiment, the FET 12 can be integrated with the n-type semiconductor layer 14. As shown FIG. 4A, the FET 12 can include a gate electrode 20 having a gate length $L_G$ and a source electrode 22. A drain region of the FET 12 can correspond to regions 24, 28 of the n-type semiconductor layer 14. In this embodiment, a drain electrode is not needed as the drain region can be connected directly to a n-region of the SSLS active p-n junction. Additionally, the drain region (or a drain electrode, when included) is connected to the cathode side of the SLSS. In this manner, the drain region of the FET channel can be monolithically integrated with the n-type semiconductor layer 14 forming the cathode side of the SSLS 10. The gate electrode 20 of the FET 12 can be of any type (e.g., Schottky, MOS, heterojunction, etc.).

FIG. 4A shows that the n-type semiconductor layer 14 can include a first horizontally extending region 24, a second horizontally extending region 26, a recessed region 28 having a recess length $L_R$ formed between the first horizontally extending region 24 and the second horizontally extending region 26, and an elevated region 30 extending upward from the second horizontally extending region 26. The first horizontally extending region 24, the second horizontally extending region 26, and the recessed region 28 form a SSLS access region within the SSLS that provides access to a side of the active p-n junction region.

As shown in FIG. 4A, the gate electrode 20 of the FET 12 can be formed on a portion of a surface of the recessed region 28. The gate electrode 20 can extend along the surface of the recessed region 28 up against a sidewall 32 forming the recessed region 28. FIG. 4A further shows that the gate electrode 20 can extend upward along the sidewall 32 over a surface 34 of the second horizontally extending region 26. The source electrode 22 can be formed on a surface 38 of the elevated region 30. The top view of FIG. 4B shows the gate electrode 20 and the source electrode 22 on the surface 34 of the second horizontally extending region 26. In an embodiment, the gate electrode 20 can be connected to the source electrode 22 as shown in FIG. 4B. Alternatively, the electrodes 20, 22 can be separated as shown in FIG. 4A. Although not shown in FIGS. 4A-4B, a modulation voltage source can be coupled to the gate electrode 20 to supply a modulation voltage of short-pulses to control the modulation of the SSLS 10. In another embodiment, the source electrode 22 can be connected to a power supply or other external circuit elements. For example, in one embodiment, the source electrode 22 can be connected to a negative terminal of the power supply.

The SSLS 10 and the integrated FET modulator 12 can be formed on a substrate/buffer 40. The substrate/buffer 40 is illustrated in FIGS. 4A-4B as one element, however, it is understood that the substrate and buffer can comprise separate elements. In one embodiment, the SSLS 10 and the FET modulator 12 can be formed on the buffer layer, which can be formed on the substrate. In one embodiment, the substrate can include sapphire, silicon carbide (SiC), silicon (Si), GaN, GaAs, AlGaN, AlON, LiGaO$_2$, InP, AlN, AlIII-BV or AlIIBVI compounds, SiO$_2$, Si$_3$N$_4$, diamond or other suitable material, and the buffer layer can include AlN, an AlGaN/AlN superlattice, and/or the like. In one embodiment, the substrate can include a non-conductive or insulating substrate. Examples of a non-conductive or insulating substrate can include highly-resistive silicon, insulating SiC, sapphire, diamond, a dielectric material, organic materials, and/or the like.

In the schematic depicted in FIGS. 4A-4B, an anode and a cathode can be formed from the aforementioned configuration of the SSLS 10 and the FET modulator 12. In one embodiment, the anode can include the p-type semiconductor layer 16, the light generating structure 18, a portion of the first horizontally extending region 24, and an anode electrode 42 formed over the p-type semiconductor layer 16, while the cathode can include the source electrode 22 of the FET 12 and the second horizontally extending region 26 and the elevated region 30 of the n-type semiconductor layer 14. In one embodiment, the anode electrode 42 and the source electrode 22 can form a pair of current supply electrodes such that one of the current supply electrodes (e.g., electrode 42) is formed over the p-type semiconductor layer and another of the current supply electrodes (e.g., electrode 22) is formed over the n-type semiconductor layer.

The SSLS 10 and the FET modulator 12 can form a group III-V materials based-device, in which some or all of the various layers are formed of elements selected from the group III-V materials system. In a more particular illustrative embodiment, the various layers of the SSLS 10 and the FET 12 can be formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials can include binary, ternary and quaternary alloys such as, AlN, GaN, InN, GaAs, GaInAs, GaInP, BN, AlGaN, AlInGaN, AlInN, AlBN, AlGaInN, AlGaBN, AlInBN, and AlGaInBN with any molar fraction of group III elements.

An illustrative embodiment of a group III nitride based light generating structure 18 that includes a multi-quantum well (e.g., a series of alternating quantum wells and barriers) can comprise $In_yAl_xGa_{1-x-y}N$, $Ga_zIn_yAl_xB_{1-x-y-z}N$, an $Al_xGa_{1-x}N$ semiconductor alloy, or the like. Similarly, both the n-type semiconductor layer 14 and the p-type semiconductor layer 16 and can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 14, 16, and 18.

In the embodiment illustrated in FIGS. 4A-4B, the active region of the FET is formed on the n-type semiconductor layer 14. This portion of the n-type semiconductor layer 14 forms a part of the SSLS access region on the cathode side of the device. As a result, no additional epitaxial layers are needed to embed the FET into SSLS design. In one embodiment, the n-type semiconductor layer can have a thickness that is several micrometers. Therefore, the recess in the n-type semiconductor layer as illustrated in FIGS. 4A-4B can be obtained by utilizing a FET with a reasonable low threshold voltage.

The threshold voltage of a FET modulator that is integrated with a SSLS can be estimated as follows. If the carrier concentration in the SSLS access region is n and the thickness of the semiconductor material under the control electrode (not necessarily the same as in the rest of the access region) is d, then the voltage for 100% light output modulation is given by:

$$V_{TH} = \frac{qnd^2}{2\varepsilon\varepsilon_0},$$

where q is the electron charge, $\varepsilon_0$ is the dielectric permittivity of a vacuum, and $\varepsilon$ is the relative dielectric permittivity of the semiconductor material (e.g., for AlGaN material, $\varepsilon \approx 9$). For an illustrative case of the access region under a control electrode having a carrier concentration of $n=10^{18}$ cm$^{-3}$, one can determine that the thickness of the recessed region is d=0.1 µm, to obtain a threshold voltage ($V_{TH}$) of an integrated FET modulator equal to 10 V.

Figure 5A:
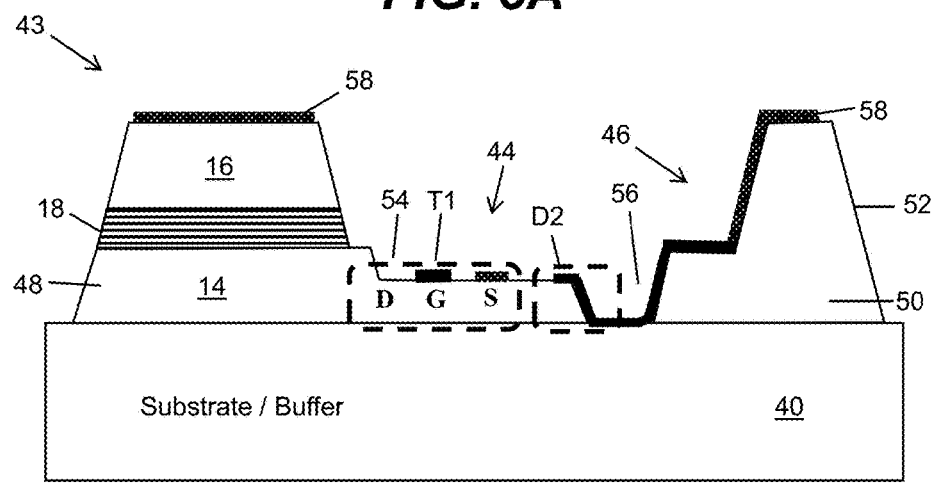
FIGS. 5A-5B show side and top schematic views of a SSLS with a monolithically integrated FET modulator and other electrical components according to an embodiment.
Figure 5B:
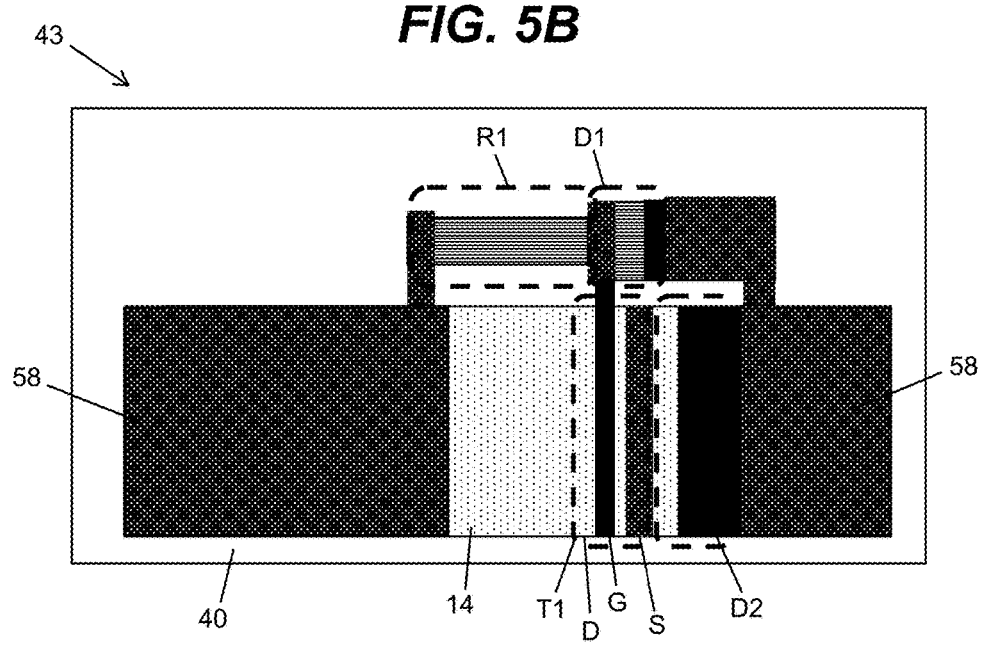

FIGS. 5A-5B show side and top schematic views of a SSLS 43 with a monolithically integrated FET modulator 44 and other electrical components 46 according to an embodiment that corresponds with the circuit depicted in FIG. 2. In particular, FIGS. 5A-5B show a cross-sectional and a top view, respectively, of a portion of the monolithically integrated SSLS 43, the FET modulator T1 44 and the electrical components 46 corresponding to resistor R1, diode D1 and diode D2 as depicted in FIG. 2.

As shown in FIG. 5A, the SSLS1 43 can include a n-type semiconductor layer 14, a p-type semiconductor layer 16 and a light generating structure 18 (e.g. a multi-quantum well) formed between the n-type semiconductor layer and the p-type semiconductor layer. The FET modulator T1 44 can be monolithically connected in series with the SSLS1. In one embodiment, the FET modulator T1 44 can be integrated within the n-type semiconductor layer 14 to form a n-channel FET. As shown FIG. 5A, the FET modulator T1 44 can include a gate electrode G, a source electrode S and a drain region D. The drain region D of the FET T1 is coupled to the n-type side of the active p-n junction region of SSLS1, while the source electrode S is coupled to the diode D2.

FIG. 5A shows that the n-type semiconductor layer 14 can include a first horizontally extending region 48, a second horizontally extending region 50, a recessed region 54 formed between the first horizontally extending region 48 and the second horizontally extending region 50, and an elevated region 52 extending upward from the second horizontally extending region 50. The first horizontally extending region 48, the second horizontally extending region 50, and the recessed region 54 form a SSLS access region within the SSLS that provides access to a side of the active p-n junction region. The FET T1 can be formed on a portion of a surface of the recessed region 54. The diode D2 can also be formed on a portion of a surface of the recessed region 54 as well as another recessed region 56 formed between the first horizontally extending region 48 and the second horizontally extending region 50 of the n-type semiconductor layer 14.

As shown in FIG. 5A, the diode D2 can extend along the surface of the recessed region 54 of the n-type semiconductor layer 14 in the first horizontally extending region 48 and down against a sidewall forming the recessed region 56. The diode D2 continues along a bottom surface of the recessed region 56 and extends up against an opposing sidewall forming the recessed region 56. The diode D2 wraps around a surface of the second horizontally extending region 50 of the n-type semiconductor layer 14 and terminates at the elevated region 38. FIG. 5A also shows the pair of current supply electrodes 58 for the active p-n junction region of the SSLS1 43. In one embodiment, one of the current supply electrodes 58 is formed over the p-type semiconductor layer 16 on the anode side of SSLS1 and another of the current supply electrodes 58 is formed over the n-type semiconductor layer 14 on the cathode side such that a portion of this electrode is formed on a top and side surface of the elevated region 52.

The top view of FIG. 5B shows the layout of the resistor R1 and the diode D1 in relation to the FET T1 and the diode D2. For example, as shown in FIG. 5B, the resistor R1 and the diode D1 are connected in series, of which this connection is parallel to the SSLS1, FET T1 and diode D2. In addition, FIG. 5B shows the gate G of the FET T1 coupled to a node formed between the resistor R1 and the diode D1. FIG. 5B further shows a top view of the current supply electrodes 58 formed on the anode and the cathode sides of the SSLS1. Like the embodiment depicted in FIGS. 4A-4B, the monolithically integrated SSLS 43 and FET 44 can be formed on a substrate/buffer 40. The substrate/buffer 40 as well as the other components in this embodiment as well as others described herein can include any of the aforementioned materials.

In the embodiment depicted in FIGS. 5A-5B, the electrical components 46 corresponding to the resistor R1, the diode D1 and the diode D2 can facilitate matching with a driver output provided by a modulation voltage applied to the FET T1 in order to optimize the operating point of the output stage or the time dependent operation of the SSLS1. In particular, optimization of the time dependent operation of SSLS1 can be chosen to minimize SSLS1 heating, while maximizing an average light output of the SSLS1 device.

FIG. 6 shows a cross sectional schematic view of a SSLS 60 with a monolithically integrated FET modulator 62 formed on the anode side of the SSLS according to one embodiment. The FET modulator 62 comprises a gate electrode 64, a source electrode 66 and a drain electrode 68. In one embodiment, the FET modulator 62 is formed over a p-type semiconductor layer 16 and a light generating structure 18 of the SSLS 60. As shown in FIG. 6, a dielectric layer 70 and a FET channel layer 72 can isolate the FET modulator 62 from the p-type semiconductor layer 16. In particular, the dielectric layer 70 and the FET channel layer 72 isolate the gate electrode 64, the drain electrode 68 and a portion of the source electrode 66 from the p-type semiconductor layer 16. The dielectric layer 70 can include, but is not limited to, $SiO_2$, $Si_3N_4$, $Al_2O_3$, and/or the like, while the FET channel layer 72 can include any suitable semiconductor material for forming a channel. In one embodiment, the dielectric layer 70 can include a dielectric material or a very low doped semiconductor material that serves to isolate the transistor channel from the p-type semiconductor layer 16.

As shown in FIG. 6, a portion of the source electrode 66 forms an anode electrode 74 that adjoins the dielectric layer 70, of which both extend over a surface 76 of the p-type semiconductor layer 16. In this manner, the anode electrode 74 and the dielectric layer 70 extend to opposing ends of the surface 76 of the p-type semiconductor layer 16. This anode side of the SSLS 60 forms the active p-n junction region used for electron-hole pair recombination and light emission. The active p-n junction region is separated from the cathode side of the SSLS that includes an elevated region 78 of the n-type semiconductor layer 14 with a cathode electrode 80 formed thereon, by a recess which provides a SSLS access region. In this manner, the anode electrode 74 and the cathode electrode 80 can form a pair of current supply electrodes for the SSLS 60.

FIG. 6 further shows that the source electrode 66 can be formed over a portion of both the anode electrode 74 and the channel layer 72 in addition to contacting a side surface of the channel layer and the dielectric layer 70 to form a connection with each. As shown in FIG. 6, the gate electrode 64 can be formed over a portion of the source electrode 66, extending along the portion of the source electrode 66 to wrap around a side of the source electrode 66 to contact a first portion 82 of a surface 84 of the channel layer 72. The drain electrode 68 can be spaced apart from the source electrode 66 and the gate electrode 64 to contact a second portion 86 of the surface 84 of the channel layer 72. Although not shown in FIG. 6, the source electrode 66 and/or drain electrode 68 can be connected to a power supply or other external circuit elements. For example, in one embodiment, the source electrode 66 can be connected to a negative terminal of the power supply. In one embodiment, the drain electrode 68 can have a connection to a positive terminal of a power supply. In one embodiment, the gate electrode 64 can be connected to a modulation voltage source for supplying a modulation voltage of short-pulses to the FET modulator 62. Although not shown, it is understood that the FET modulator in this embodiment as well as others disclosed herein can include one or more gate electrodes that are coupled to the contacts of the SSLSs.

In this embodiment depicted in FIG. 6, the SSLS 60 and the FET modulator 62 can be formed on a substrate/buffer 40 which can include any of the aforementioned materials. Although the substrate/buffer 40 is illustrated in FIG. 6 as one element, it is understood that the substrate and buffer can comprise separate elements. In one embodiment, the SSLS 60 and the FET modulator 62 can be formed on the buffer layer, which can be formed on the substrate. In one embodiment, the substrate can include a conductive substrate. Examples of a conductive substrate can include, but are not limited to, doped silicon, doped SiC, doped GaAs, doped GaN, and other semiconductor materials.

FIG. 7 shows a cross sectional schematic view of a SSLS 88 formed on a substrate 40 with a monolithically integrated FET modulator 90 formed over a p-type semiconductor layer 16 and a light generating structure 18 of the SSLS according to an embodiment. In this embodiment, the SSLS 88 and the FET modulator 90 form a vertical structure as the anode side including the anode electrode 74 and the cathode side including the cathode electrode 80 of the SSLS are positioned vertically in relation to each other as opposed to the embodiment depicted in FIG. 6 in which the cathode and the anode are horizontal or lateral with respect to each other. In this manner, the FET modulator 90 can be formed on top of the p-type semiconductor layer 16 of the SSLS 88, while cathode electrode 80 of the SSLS can be formed on the back side of the substrate 40. A vertical structure is advantageous in that a small total device size can be achieved. Other than the vertical structure of the anode and the cathode, the FET modulator 90 is essentially similar to the FET modulator 62 depicted in the embodiment of FIG. 6 in that the layouts are alike and formed over the FET channel layer 72 and the dielectric layer 70.

It is understood that the various structures of the SSLSs and integrated FET modulators depicted in FIGS. 4-7 are only illustrative of various possibilities for integrating a FET modulator with a SSLS, and those skilled in the art will appreciate that these elements can be implemented in other configurations. For example, instead of having the FET modulator integrated with either the p-type semiconductor layer 16 or the n-type semiconductor layer 14, it can be formed within both the p-type semiconductor layer 16 and the n-type semiconductor layer 14. In another embodiment, the structures of SSLSs and integrated FET modulators can include multiple mesas of such elements. In another embodiment, control electrodes can be placed between the SSLS cathode and the mesa, the SSLS anode and the mesa, as well as between both the SSLS anode and the SSLS cathode and the mesa, or any other types of SSLS active regions. Also, although the various structures described herein depict the n-type semiconductor layer in a bottom portion of the SSLS and the p-type layer in a top portion, it is understood that these layers can be interchanged in their positions within the SSLS.

It is also understood that the FET modulator can include any type of FET with a normally-on channel that is in a conducting state when no external voltage is applied to it. For illustrative purposes the FET design can be for a MESFET type device, however, it is understood that the design or variations thereof are suitable for other FET devices such as MOSFET types, JFET types, heterojunction FETs, or HEMT types.

Figure 8A:
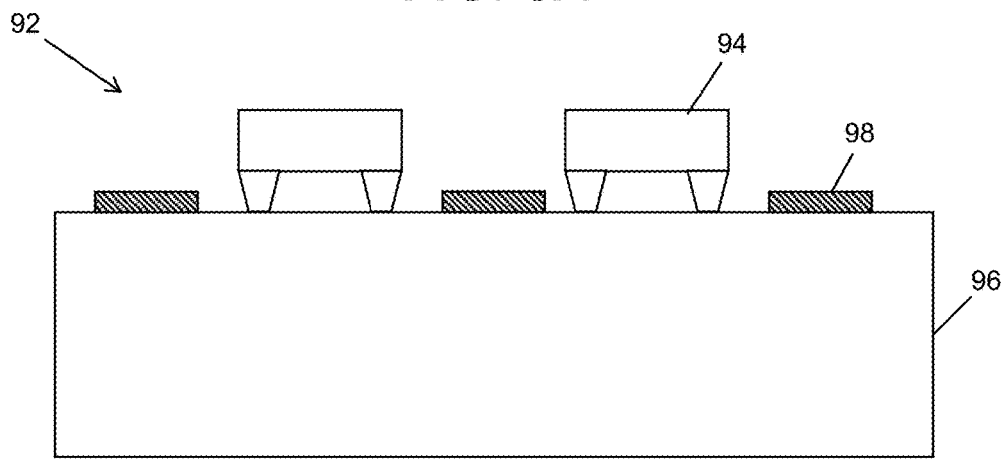
FIG. 8A shows a schematic of a flip-chip mounting arrangement of devices including a SSLS with a monolithically integrated FET modulator mounted on a submount with pulse driver circuits positioned between the devices according to an embodiment.
Figure 8B:
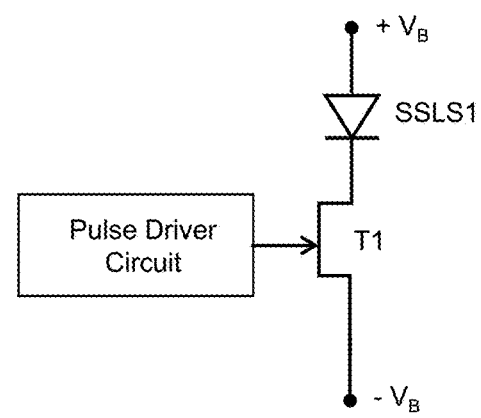
FIG. 8B illustrates a schematic representation of one of the individual devices containing a SSLS and a FET modulator driven by one of the pulse driver circuits.

FIG. 8A shows a schematic of a flip-chip mounting arrangement 92 of devices 94 including a SSLS with a monolithically integrated FET modulator mounted on a submount 96 with pulse driver circuits 98 positioned between the devices according to an embodiment. FIG. 8B also illustrates a schematic representation of one of the individual devices containing a SSLS and a FET modulator driven by one of the pulse driver circuits. This schematic representation is similar to the circuit diagram depicted in FIG. 1 except that the modulation voltage source has been replaced with a pulse driver circuit. Like the modulation voltage source, the pulse driver circuit delivers voltages to the gate of FET T1. The voltage pulses have a pulse amplitude and polarity configured to turn on and off current flowing through the FET T1. Like FIG. 1, the cathode of SSLS1 is connected to the source of the FET T1, while the anode of SSLS1 and the drain of FET T1 are connected to the positive and negative terminals of a voltage supply $V_B$, respectively. In operation, the voltage pulses from the pulse driver circuit allows the FET T1 to control a drive current supplied to the SSLS1, enabling a fast and efficient light modulation.

The pulse driver circuits 98 schematically depicted in FIG. 8A can be any silicon-based integrated circuit pulse driver or any other driver that can provide a pulse output sufficient to modulate the integrated power output stage of the SSLS. Examples of a pulse driver circuit can include, but are not limited to, a computer clock, CPU, oscilloscope, and/or the like. It is understood that the type of pulse driver circuit deployed in this configuration does not need to provide a high output current because the input impedance of the field-effect transistor is very high. Generally, the main requirement for the pulse driver circuit is to provide sufficient output voltage, typically in the range of about 5 V to about 10 V to modulate the power output stage of the SSLS.

Figure 9:
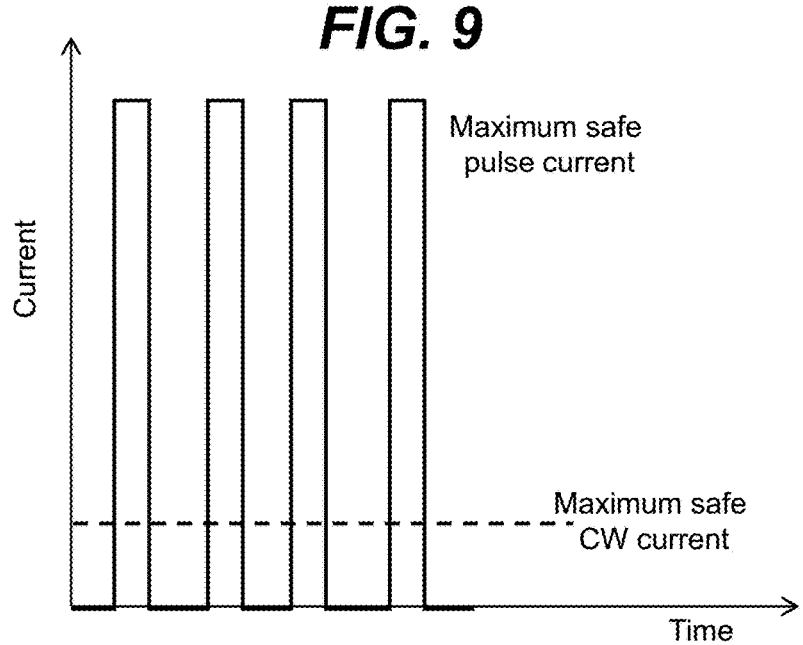
FIG. 9 illustrates the short-pulse operation of a SSLS with a monolithically integrated FET modulator according to one of the embodiments described herein in comparison to a SSLS operating with continuous wave (CW) mode or under long-pulse driving conditions.

FIG. 9 illustrates the short pulse operation of a SSLS with a monolithically integrated FET modulator according to one of the embodiments described herein in comparison to a SSLS operating with continuous wave (CW) mode or under long-pulse driving conditions. In particular, FIG. 9 illustrate that the short-pulse operation of a SSLS with an integrated FET modulator is able to attain output optical pulses with magnitudes that are significantly higher than those achieved with SSLSs operating in a CW mode or a long-pulse mode. The dotted line extending through the pulses of FIG. 9 represents the maximum safe CW levels for a SSLS operating under such conditions. A SSLS operating in CW or long-pulse mode has limited maximum output optical pulse magnitudes because these devices are typically affected by severe self-heating and degradation effects. A SSLS with an integrated FET modulator as disclosed herein will have much smaller self-heating, and as a result, the output power of a device that includes one of the SSLS and the integrated FET modulator configuration will greatly exceed that of a conventional SSLS. This effect is evident in FIG. 9 as the maximum output optical pulse magnitude for a SSLS operating in a short-pulse mode is significantly greater than the maximum safe output optical pulse level of a SSLS operating in a CW mode. The achievable power increase between the two types of SSLSs is inversely proportional to the obtained pulse temperature decrease between the two. This power increase can be estimated as follows:

$$P_P/P_{CW} \approx 1/[0.63 \times (t_P/\tau_T)], \text{ wherein}$$

$P_P$ is an average power delivered to the SSLS in a pulsed mode, $P_{CW}$ is the power delivered to the SSLS in a continuous wave mode, $t_P$ is short-current pulse duration, and $\tau_T$ is a characteristic time for the self-heating of a SSLS.

Figure 10:
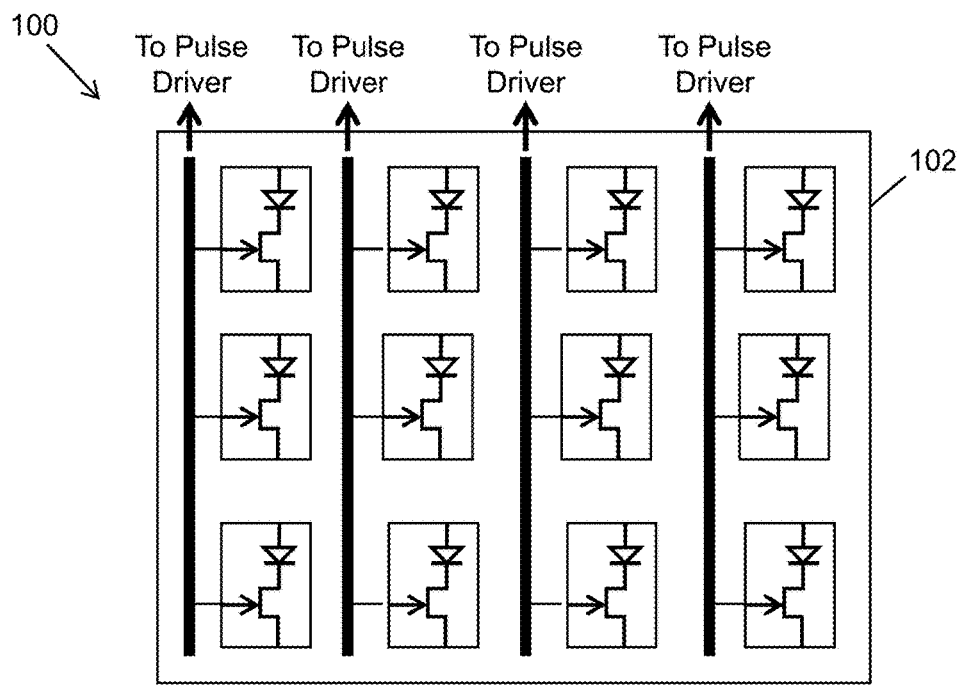
FIG. 10 shows a schematic of a SSLS device including an array of SSLSs having an integrated FET modulator connected to pulse driver circuits according to an embodiment.

FIG. 10 shows a schematic of a SSLS device 100 including an array 102 of SSLSs each having an integrated FET modulator connected to a pulse driver according to an embodiment. In this embodiment, each of the SSLSs and their respective integrated FET modulators in the array 102 can be arranged in rows and columns such that each SSLS and FET modulator element is connected to a pulse driver circuit. As shown in FIG. 10, each column of the array 102 can be driven by a pulse driver wherein a pulse driver bus connects the pulse driver to each SSLS and FET modulator element in the column. It is understood that pulse drivers can be connected to the SSLS and FET modulator elements of the array 102 in other configurations. For example, the pulse drivers can be connected to each SSLS and FET modulator element in a row as opposed to a column-based connection. It is also understood that the integrated bias traces for each of the FET modulators are not shown for clarity, however those skilled in the art will appreciate that these modulators would have DC bias traces connecting to the driver output(s) as illustrated in the example of FIG. 8B.

In the configuration depicted in FIG. 10, the SSLS device 100 with array 102 of SSLSs and integrated FET modulators connected to a pulse driver can be used to emit a light that is perceived as a continuous light due to a large number of pulsed SSLS devices connected as an array. In an embodiment, the time duration and phase of the SSLSs can be coordinated for the array of LEDs to output a relatively constant intensity. This arrangement allows for simultaneous control of more light sources while also allowing a geometric distribution of the light sources to provide a uniform large area illumination. In operation, the SSLS device 100 with array 102 of SSLSs and integrated FET modulators connected to a pulse driver can operate as a uniform light fixture with increased reliability and improved thermal management.

Figure 11:
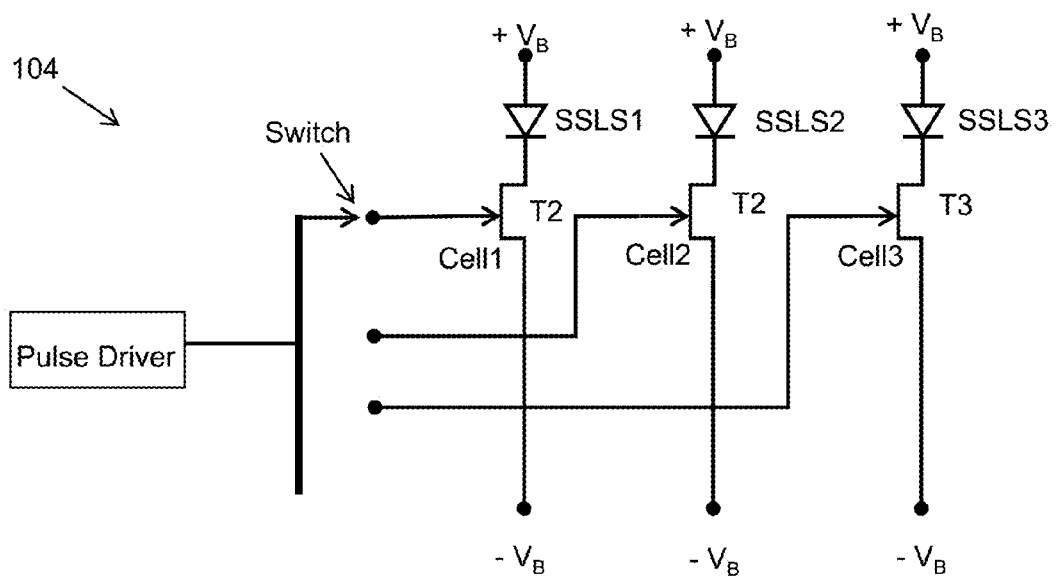
FIG. 11 shows a schematic circuit implementation of an array of SSLSs each having an integrated FET modulator connected to a pulse driver through a switch according to an embodiment.

FIG. 11 shows a schematic circuit implementation of an array 104 of SSLSs each having an integrated FET modulator connected to a pulse driver through a switch according to an embodiment. As depicted in FIG. 11, each SSLS and integrated FET modulator forms a cell (e.g., Cell1, Cell2 and Cell3) that connects to the pulse driver through the switch connecting an input line of the gate of the cell's FET. In one embodiment, the implementation depicted in FIG. 11 can be used to generate a quasi-CW optical output at a much higher level than that is achievable from conventional SSLSs operating in a CW mode. In particular, connecting each of the FET modulators of the multiple cells (e.g., Cell1, Cell2, and Cell3) to a fast electronic switch in the manner depicted in FIG. 11 can facilitate a circular reconnection of the cells to the pulse driver.

For example, the switch can reconnect the cells circularly so that every next pulse from the pulse driver is applied to the next SSLS in the array (i.e., the cells). Through this operation, the array 104 of SSLSs each having an integrated FET modulator can emit an optical power that is in a quasi-CW mode due to a large number of devices that can be synchronized, such that when some devices turn off others turn on resulting in substantially the same overall light intensity. This quasi-CW mode of the array 104 can have an optical power output that is at a much higher level because in pulsed mode the LEDs can be operated at higher current resulting in higher light output intensity without overheating the devices. As a result, the optical power output generated from the array 104 is at a level that is much higher than that which is achievable with a single element or multi-elements operating in a CW mode.

Figure 12:
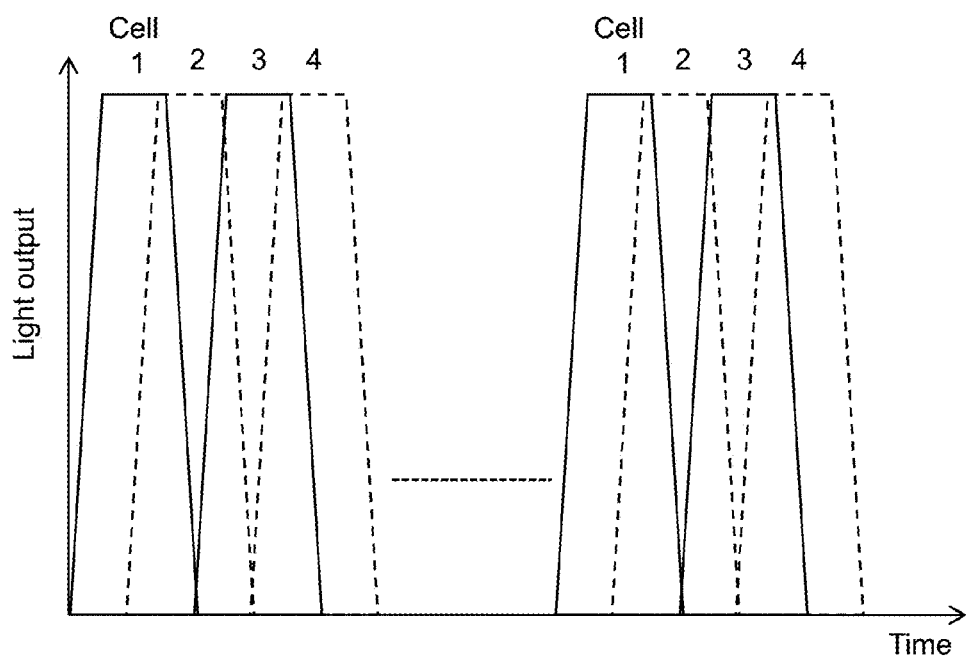
FIG. 12 shows an illustrative timing diagram of the switched array of SSLSs similar to that depicted in FIG. 11 according to an embodiment.

FIG. 12 shows an illustrative timing diagram of a switched array of SSLS cells similar to that depicted in FIG. 11 according to an embodiment. As shown in FIG. 12, there is a time delay between the application of pulses to each of the cells in the array (e.g., Cell1, Cell2, Cell3 and Cell4) over their time of use. This time delay is due to the time delay of the switch ("the switch time delay") and is illustrated in FIG. 12 by the overlap in the pulse widths between the cells. This overlap of the pulse widths between the cells is a function of the switch time delay. In this manner, the overlap of the pulses widths depicted in FIG. 12 enables the switched array of SSLS cells and accompanying FET modulators to attain a quasi-CW optical output as described with regard to FIG. 11.

Figure 13:
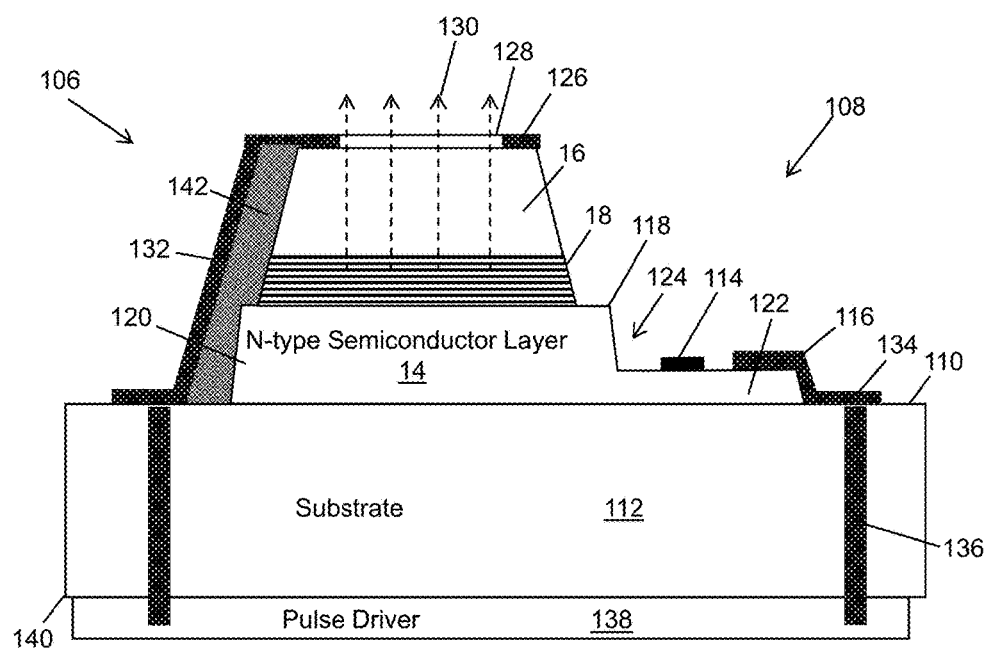
FIG. 13 shows a cross sectional schematic view of a SSLS formed on a substrate coupled to a pulse driver, with a monolithically integrated FET modulator formed over a n-type semiconductor layer of the SSLS according to an embodiment.

FIG. 13 shows a cross sectional schematic view of a SSLS 106 with a monolithically integrated FET modulator 108 according to another embodiment. In this embodiment, the SSLS 106 and the FET modulator 108 can be formed on a first surface 110 of a substrate 112. The substrate 112 can include sapphire, silicon carbide (SiC), silicon (Si), GaN, AlGaN, AlON, LiGaO$_2$, or another suitable material. As shown in FIG. 13, the SSLS 106 can include a n-type semiconductor layer 14, a p-type semiconductor layer 16, and a light generating structure 18 formed between the n-type semiconductor layer, and the p-type semiconductor layer, which collectively form the active p-n junction region within the SSLS 106 for electron-hole pair recombination and light emission.

In one embodiment, embodiment, the FET modulator 108 can be integrated with the n-type semiconductor layer 14. For example, the FET modulator 108, which can include a gate electrode 114, a source electrode 116, and a drain region 118, are formed on various regions of the n-type semiconductor layer 14. As shown in FIG. 13, the drain region 118 can be formed on a first horizontally extending region 120 of the n-type semiconductor layer 14, while the gate electrode 114 and the source electrode 116 can be formed on a second horizontally extending region 122 in a recessed region 124 of the n-type semiconductor layer 14.

The SSLS 106 can further include a p-type contact 126 formed over the p-type semiconductor layer 16. The p-type contact 126 can have a transparent window 128 for transmitting light 130 emitted from the light generating structure 18. In one embodiment, the SSLS 106 can operate as a light emitting diode (LED) such as for example an ultraviolet LED. In one embodiment, the p-type contact 126 with transparent window 128 can include a mesh-like contact having openings with a sufficient lateral area for permitting emitted light 130 to exit the SSLS 106. Generally, the typical distance for separation between contact domains, where contact domains comprise the surface of a mesh forming a contact to p-type layer, of a mesh-like contact can be about the distance of the current spreading length L within the p-type semiconductor layer 16. In one embodiment, the separation distance is at most the distance L. It is understood, that the mesh-like contact can be formed on the p-type semiconductor layer 16 using well-known deposition techniques including, but not limited to, evaporation and sputtering.

The anode side of the SSLS 106 can be formed by connecting an anode electrode 132 to the p-type contact 126, while the cathode side of the SSLS can be formed connecting a cathode electrode 134 to the source electrode 116. Both the anode electrode 132 and the cathode electrode 134 can form the pair of current supply electrodes for the SSLS 106. As shown in FIG. 13, both the anode electrode 132 and the cathode electrode 134 can penetrate through the first surface 110 of the substrate 112 into vias 136 formed through the substrate into a pulse driver 138 formed on a second surface 140 of the substrate. In this manner, the pulse driver 138 can apply a modulation voltage to the FET modulator 108 for modulation of the SSLS 106.

In one embodiment, a dielectric material 142 can be formed between the anode electrode 132 and the side of the active p-n junction region of the SSLS 106 opposite the recessed region 124. In this manner, the dielectric material 142 can isolate the contact 132 from the active layer and adjacent semiconductor layers. The dielectric material 142 can include, but is not limited to, $SiO_2$, AAO, $CaF_2$, $MgF_2$ and/or the like.

Figure 14:
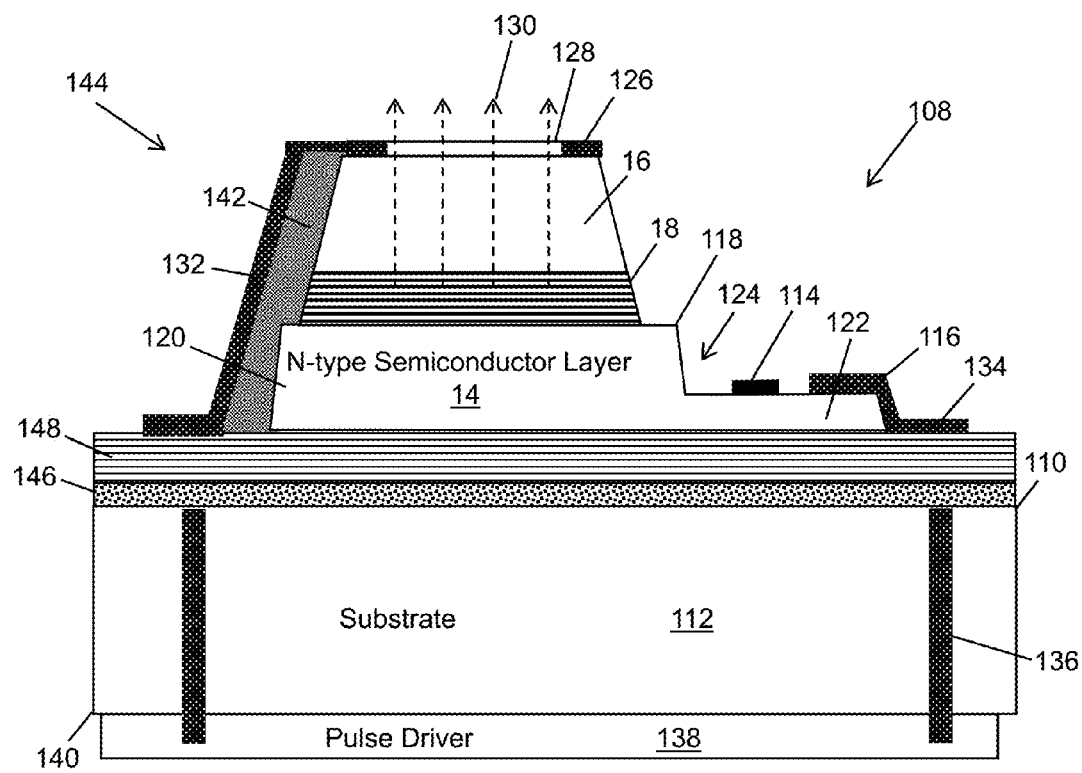
FIG. 14 shows a cross sectional schematic view of a SSLS formed on a substrate coupled to a pulse driver integrated circuit, with a monolithically integrated FET modulator formed over a n-type semiconductor layer of the SSLS, and a Bragg reflector mirror and a buffer layer formed on the substrate according to an embodiment.

FIG. 14 shows a cross sectional schematic view of a SSLS 144 with a monolithically integrated FET modulator 108 according to another embodiment. The SSLS 144 with integrated FET modulator 108 is similar to the SSLS 106 and the FET modulator 108, except in this embodiment a buffer layer 146 and a Bragg reflector mirror 148 are formed on the substrate 112 to further facilitate extraction of light from the SSLS 144. The buffer layer 146 and the Bragg reflector mirror 148 can be epitaxially grown over the substrate 112. In one embodiment, the substrate 112 can include a thermally conductive substrate including, but not limited to, Si, AlN, and SiC. In one embodiment, the thermally conductive substrate can include regions of high thermal conductivity with the thermal conductivity of each region comparable to that of the thermal conductivity of aluminum. In another embodiment, the substrate 112 can include a composite structure that incorporates highly conductive domains such as, for example, aluminum. It is understood that for any composite substrate, materials should be selected with similar thermal expansion coefficients to prevent cracking and substrate deterioration. In one embodiment, the buffer layer 146 can include, but is not limited to, AlN or GaN.

In one embodiment, the Bragg reflector mirror 148 can include $Al_xGa_{1-x}N/Al_yGa_{1-y}N$ semiconductor sub-layers, wherein the index of refraction of sub-layers can be changed due to changes in molar concentration of aluminum nitride. In one embodiment, the Bragg reflector mirror 148 can include a set of pairs of a first and a second layer of AlGaN being $Al_xGa_{1-x}N/Al_yGa_{1-y}N$ layers with a molar fraction x and y, as well as thicknesses and the number of periods of the first and second AlGaN layers chosen to result in at least 10% of reflectivity. In order to attain an efficient Bragg reflective mirror, the sub-layers can have a quarter wavelength thickness for the target radiation of the SSLS device.

Figure 15:
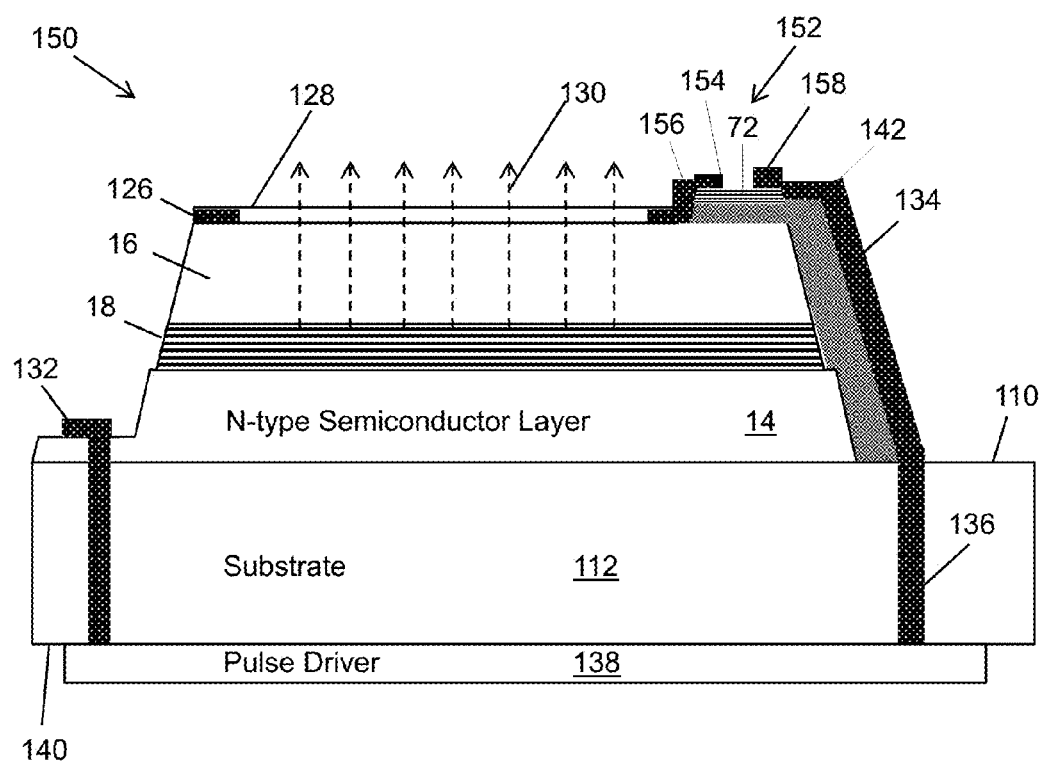
FIG. 15 shows a cross sectional schematic view of a SSLS formed on a substrate coupled to a pulse driver integrated circuit, with a monolithically integrated FET modulator formed over a p-type semiconductor layer of the SSLS according to an embodiment.

FIG. 15 shows a cross sectional schematic view of a SSLS 150 with a monolithically integrated FET modulator 152 according to another embodiment. In this embodiment, the FET modulator 152 can be formed over the p-type semiconductor layer 16 of the SSLS 150. As shown in FIG. 15, the SSLS 150 and the FET modulator 152 can be formed on a first surface 110 of a substrate 112. Like other embodiments described herein, the SSLS 150 can include the n-type semiconductor layer 14, the p-type semiconductor layer 16, and the light generating structure 18 formed between the n-type semiconductor layer, and the p-type semiconductor layer to form the active p-n junction region within the SSLS for electron-hole pair recombination and light emission.

As discussed herein, the FET modulator 152 is formed over the p-type semiconductor layer 16. This can reduce parasitic effects related to parasitic resistance that are present when using modulation at the cathode side. FIG. 15 shows that the FET modulator 152, which can include a gate electrode 154, a source electrode 156, and a drain region 158, are formed on various regions of the p-type semiconductor layer 16. In one embodiment, the gate electrode 154, the source electrode 156, and the drain region 158 of the FET modulator 152 can be isolated from the p-type semiconductor layer 16 by a FET channel layer 72 and a dielectric material 142. Both the FET channel layer 72 and the dielectric material 142 can include, but is not limited to, the aforementioned materials. In one embodiment, the source electrode 156 is coupled to the p-type contact 126 while contacting a side surface of the channel layer 72 and the dielectric material 142. The gate electrode 154 can be formed over a portion of the source electrode 156 and extend along the portion of the source electrode 156 to wrap around a side of the source electrode 156 to contact a first portion of a surface of the FET channel layer 72. The drain region 158 can be spaced apart from the source electrode 156 and the gate electrode 154 to contact a second portion of the surface of the channel layer 72.

The source electrode 156 and/or drain region 158 can be connected to a power supply or other external circuit elements. For example, in one embodiment, the source electrode 156 can be connected to a negative terminal of the power supply. In one embodiment, the drain region 158 can have a connection to a positive terminal of a power supply. In one embodiment, the gate electrode 154 can be connected to a modulation voltage source for supplying a modulation voltage of short pulses to the FET modulator 152.

Like the embodiments depicted in FIGS. 13-14, the SSLS 150 can further include a p-type contact 126 formed over the p-type semiconductor layer 16. The p-type contact 126 can have a transparent window 128 for transmitting light 130 emitted from the light generating structure 18. In one embodiment, the p-type contact 126 with transparent window 128 can include a mesh-like contact having openings as previously described.

The anode side of the SSLS 150 can be formed by an anode electrode 126 with the voltage supplied through the electrode 136. The electrode 132 forms a cathode electrode for the SSLS 150 and delivers electrons to the n-type layer of the SSLS device. Both the electrode 132 and the electrode 134 can form the pair of current supply electrodes for the SSLS 150. As shown in FIG. 15, both the electrode 132 and the electrode 134 penetrate through the first surface 110 of the substrate 112 into vias 136 formed through the substrate into a pulse driver 138 formed on a second surface 140 of the substrate. In this manner, the pulse driver 138 can apply a modulation voltage to the FET modulator 152 for modulation of the SSLS 150.

Figure 16A:
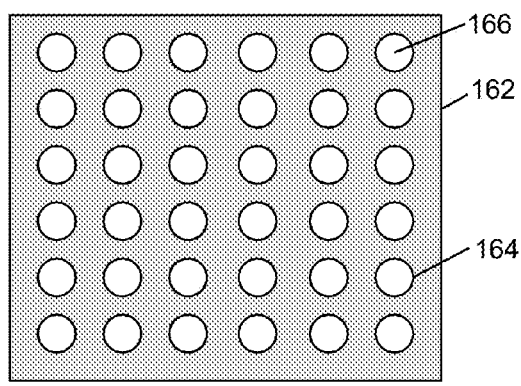
FIGS. 16A-16C show schematic diagrams illustrating various examples of beam formation in a SSLS structure having an array of SSLS elements according to an embodiment.
Figure 16B:
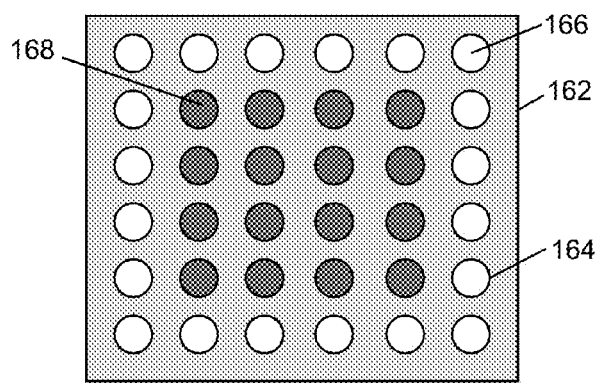
Figure 16C:
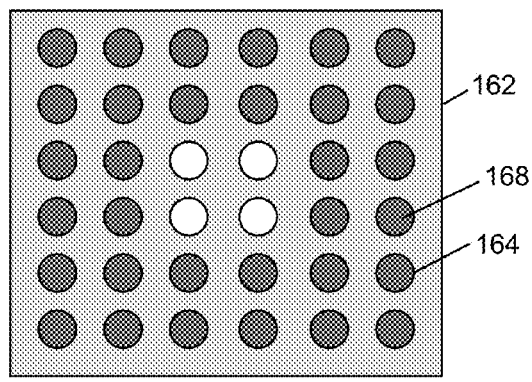

FIGS. 16A-16C show schematic diagrams illustrating various examples of beam formation in a SSLS structure 160 having an array 162 of multiple SSLS elements 164 with built-in FET modulators (not illustrated) according to an embodiment. The multi-element SSLS structure 160 of SSLS elements 164 and modulators can be arranged in rows and columns. In one embodiment, the SSLS structure 160 in the array 162 of SSLS elements 164 can take the form of a lamp, while the SSLS elements 164 can include individual semiconductor LEDs, each representing a pixel in the lamp. In one embodiment, the SSLS elements 164 can include lasers. In still another embodiment, the SSLS elements 164 can include a combination of LEDs and lasers.

The built-in FET modulators can reconfigure the SSLS beam width and/or shape generated from the SSLS structure 160 to take on a variety of displays with the use a modulation voltage source, a pulse driver circuit, and/or the like. For example, in FIG. 16A, all the SSLS pixels can be activated by turning on the current controlling FETs associated with each of the SSLS elements 164. Note that in FIGS. 16A-16C, activated pixels are represented by clear pixels 166, while inactive pixels are represented by dark pixels 168. With regard to the example illustrated in FIG. 16B, only the SSLS pixels located in the peripheral region of the lamp are activated by turning on the current controlling FETs of these respective SSLS elements, while the remaining internal pixels are inactivated. In FIG. 16C, only the SSLS pixels located in the central region of the lamp are activated by turning on the current controlling FETs of these respective SSLS elements, while the remaining pixels are inactivated. It is understood that the beam formations illustrated in FIGS. 16A-16C are only illustrative of a few possible options and are not meant to be limiting. Nevertheless, the beam formations generated from the lamp can arise as result of fast and efficient modulation of the SSLS elements 164 effectuated by the built-in FET modulators. In particular, the SSLS structure 160 with multi-SSLS elements 164 each having integrated FET modulators is subject to less parasitic parameters due to the extremely fast switching capability provided by the FET modulators, making various reconfigurable beam shapes and/or widths easily attainable.

Figure 17A:
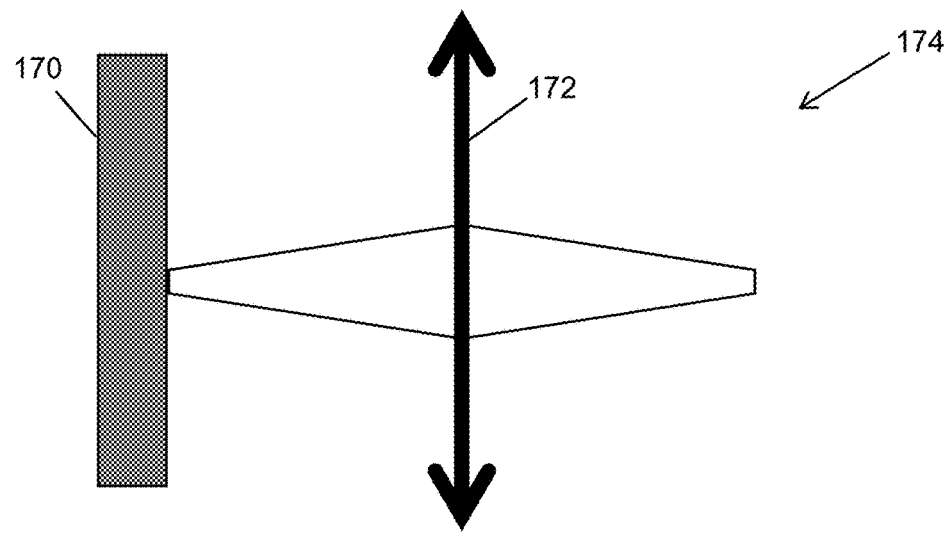
FIGS. 17A-17B show illustrative examples of a SSLS structure having SSLS elements with monolithically integrated FET modulators connected to an optical lens for beam formation in an illumination system according to an embodiment.
Figure 17B:
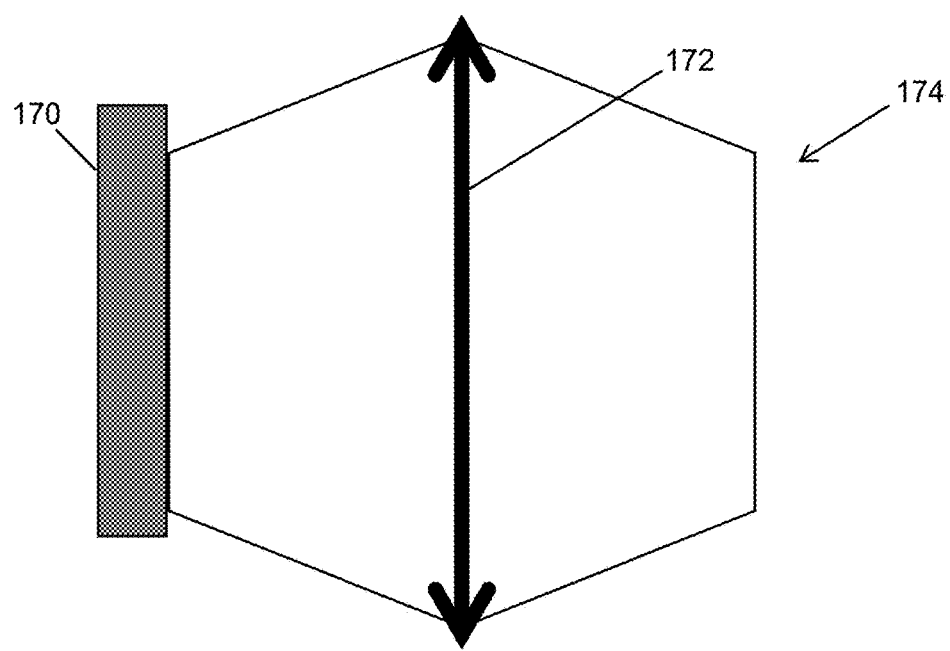

FIGS. 17A-17B show illustrative examples of a SSLS structure 170 having SSLS elements with monolithically integrated FET modulators connected to an optical lens 172 for beam formation in an illumination system 174 according to an embodiment. In this embodiment, the SSLS structure 170 can take the form of a lamp having SSLS elements that include individual semiconductor LEDs each having integrated FET modulators. As mentioned previously, the SSLS elements can include lasers, or combination of LEDs and lasers.

The optical lens 172 can include one of a variety of optical devices, including, but not limited to, bulk optical lens, Fresnel lens, Fresnel zone plates, etc. While a particular optical lens is not shown, the optical lens 172 can at least partially cover an emitting surface of the SSLS structure 170. The optical lens 172 can have some separation distance from the surface to allow for light control such as light focusing. It is understood that in an embodiment, the lens 172 can be movable to provide dynamic control of the light being output from the surface of the array of SSLS elements. The optical lens 172 can be coupled to the SSLS structure 170 in a variety of approaches. For example, the optical lens 172 can be mechanically connected to the SSLS structure 170. In another embodiment, the optical lens 172 can be incorporated with the SSLS structure 170 using hybrid or monolithic integration.

The SSLS structure 170 and the optical lens 172 can operate in conjunction with a modulation voltage source, a pulse driver circuit, and/or the like, to form beams of light having varying shapes and widths. For example, FIG. 17A shows the SSLS structure 170 and the optical lens 172 generating a narrowly focused beam light, while FIG. 17B shows the SSLS structure and the lens generating a wider-shaped beam. The narrowly focused beam light generated in FIG. 17A can be obtained by having the integrated FET modulators activate a central portion of the LEDs in the SSLS structure while keeping the LEDs on the outer portion of the multi-element structure inactive. The wider shaped beam generated in FIG. 17B can be obtained by having all of the integrated FET modulators activate their respective LEDs in the SSLS structure. It is understood that the beam formations illustrated in FIGS. 17A-17B that can be obtained by implementing an optical lens 172 in a SSLS structure 170 of SSLS elements having integrated FET modulators in an illumination system are only illustrative of a few possible shapes and widths and are not meant to be limiting. All of the possible reconfigurable beam shapes and/or widths that are attainable with these embodiments have the advantage in comparison to conventional illumination systems because the SSLSs with integrated FET modulators afford extremely fast switching capability due to less parasitic parameters.

The SSLS structures with arrays of multiple SSLS elements and built-in FET modulators as referenced with regard to FIGS. 16A-17B can be configured to generate light according to one of several different parameters. For example, the array of SSLS elements can generate light with a radiation intensity as a function of time. In this manner, the radiation generated from a SSLS structure having an array of SSLS elements and FET modulators will correspond to the sum of all of the time dependent radiation intensities of each individual SSLS element within the array. In one embodiment, the SSLS elements can be configured to generate light at a multiple of different wavelengths. For example, the SSLS elements in the array can have peak wavelengths that range from about 210 nm to about 500 nm with a full width at half maximum (FWHM) between about 10 nm to about 60 nm. In another embodiment, the individual SSLS elements within the array can have different angular distributions of intensity. In still another embodiment, a filtering device can be incorporated within the SSLS structure of an array of SSLS elements to filter certain wavelengths of light emitted from the SSLSs.

Figure 18:
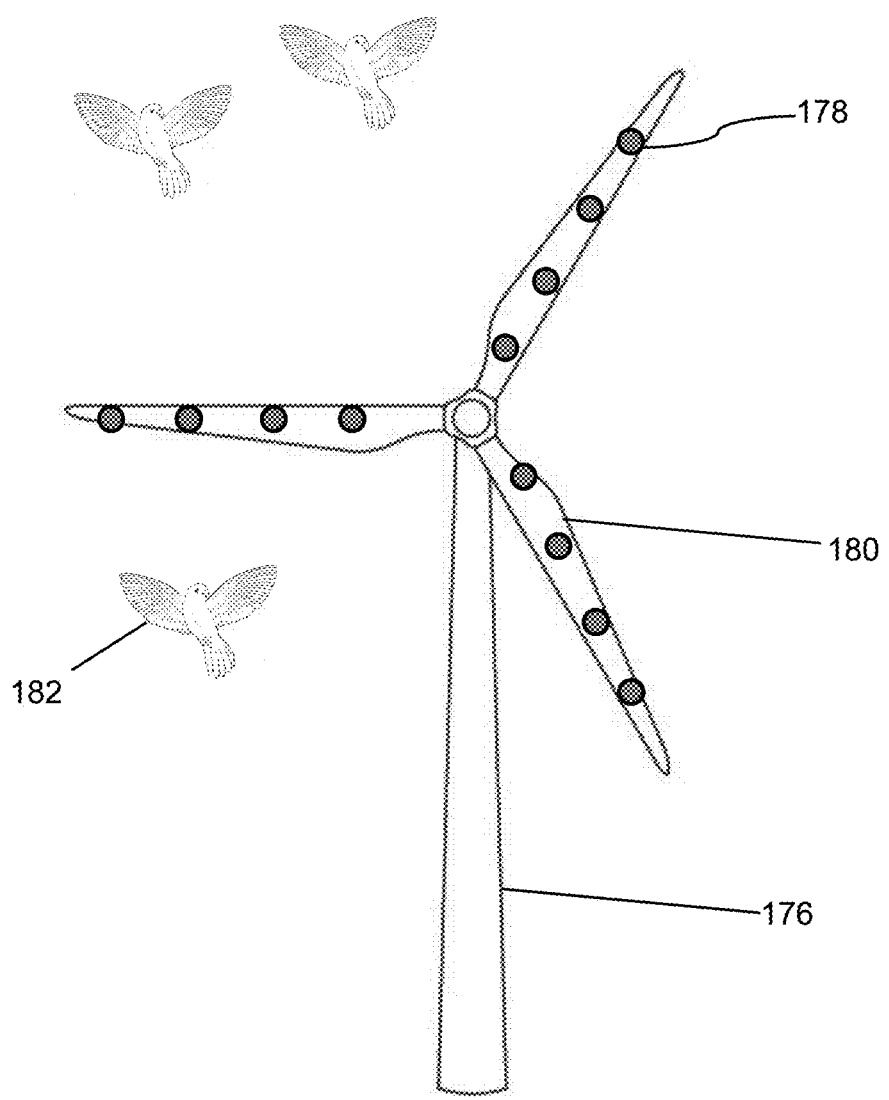
FIG. 18 shows a schematic of a wind turbine having a multitude of SSLS devices with monolithically integrated FET modulators and pulse drivers placed on the rotating turbine blades to generate bright flashes of light according to an embodiment.

The SSLS structures with integrated FET modulators as described in the various embodiments of the present invention are suitable for use in a wide variety of illumination applications where high powered SSLS devices operating in a short-pulse modulated mode are beneficial. For example, the SSLSs with integrated FET modulators can be used in applications where it is desirable to have the SSLSs generate bright flashes of visible light. In one example, FIG. 18 shows a schematic of a wind turbine 176 having a multitude of SSLS devices 178 with monolithically integrated FET modulators and pulse drivers placed on the rotating turbine blades 180 to generate bright flashes of light. The pulse drivers and the FET modulators can control the SSLSs in the aforementioned manner to generate high powered, short-pulses of bright light. In one embodiment, the SSLS devices 178 can include ultraviolet LEDs that can be used to scare birds 182 away from the rotating turbine blades 180. In this embodiment, the light generated from each of the SSLS devices can have a wavelength that is sufficient to scare birds 182 and keep them away from flying into the rotating turbine blades 180 so that the birds are safe and do not impair operation of the wind turbine 176. Generally, light emanating with a wavelength that ranges from about 320 nm to about 420 nm is sufficient enough to be detected by the birds 182 and frighten them away from the wind turbine 176.

Figure 19:
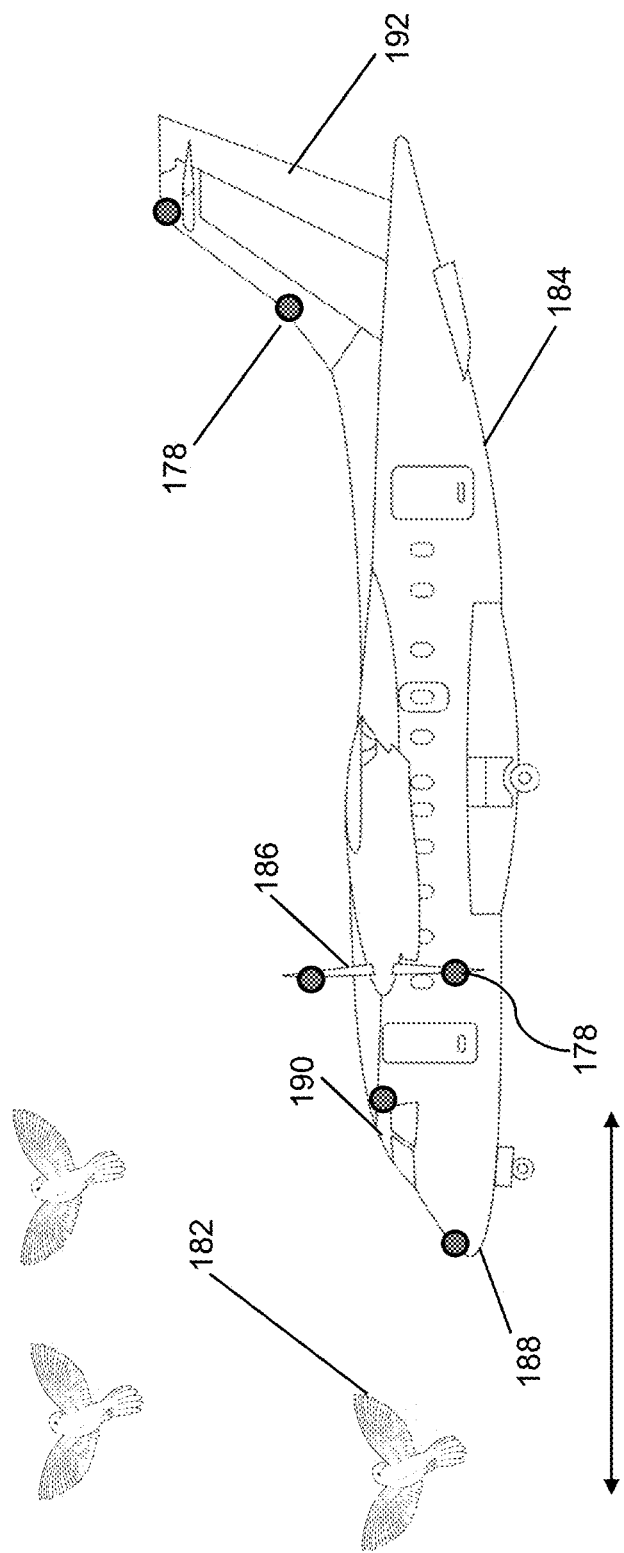
FIG. 19 shows a schematic of an airplane having a multitude of SSLS devices with monolithically integrated FET modulators and pulse drivers placed on various locations of the plane to generate bright flashes of light according to an embodiment.

In another embodiment, the SSLSs with integrated FET modulators can be placed on an aircraft. For example, FIG. 19 shows a schematic of an airplane 184 having a multitude of SSLS devices 178 with monolithically integrated FET modulators and pulse drivers placed on various locations of the plane to generate bright flashes of light according to an embodiment. As shown in FIG. 19, the SSLS devices 178 can be placed on locations of the plane 184 that include, but are not limited to, the engine blades 186, the nose 188, the cockpit windows 190 and parts of the tail 192 and/or wings. The pulse drivers and the FET modulators can control the SSLSs in the aforementioned manner to generate high powered, short-pulses of bright light. In one embodiment, the SSLS devices 178 can include ultraviolet LEDs that can be used to scare birds 182 away from the plane 184. Light emanating with a wavelength that ranges from about 320 nm to about 420 nm is sufficient enough to be detected by the birds 182 and frighten them away from the plane 184. In another embodiment, the light emanating from the SSLS devices 178 can have an intensity set as a function of the speed of the airplane 184 and/or its currents location (e.g., take-off, landing or cruising at a travel elevation). For example, the intensity of the light can be greater at periods of taking-off and landing in order to allow sufficient reaction time for the birds 182 to fly away from the aircraft 184 and avoid being killed and possibly impairing the operation of the plane.

It is understood that the examples depicted in FIGS. 18-19 are only illustrative of a few possibilities of how high powered SSLS devices operating in a short-pulse modulated mode with integrated FET modulators can be used in illumination applications. These examples are not meant to be limiting as those skilled in the art will appreciate that there are a multitude of applications for devices that include one of the various embodiments described herein. For example, the SSLSs with integrated FET modulators can be deployed in applications that include hot air balloons, toll booths, bicycle and pedestrian reflectors, snow plows, police cars and other parties that may attend to cars located at busy areas such as for example, tow truck drivers.

Further, it is understood that the SSLSs with integrated FET modulators can be used to generate other patterns of bright pulses of light. For example, the patterns can include random/semi-random pulses of light emitted at a random/semi-random durations with random/semi-random pauses in between the light. The random/semi-random nature of the pulses of light including the amplitude of the light, the duration of the light pulses and the pauses in between the flashes can be selected as a function of a periodicity that is easily detected by those seeing the light.

Figure 20:
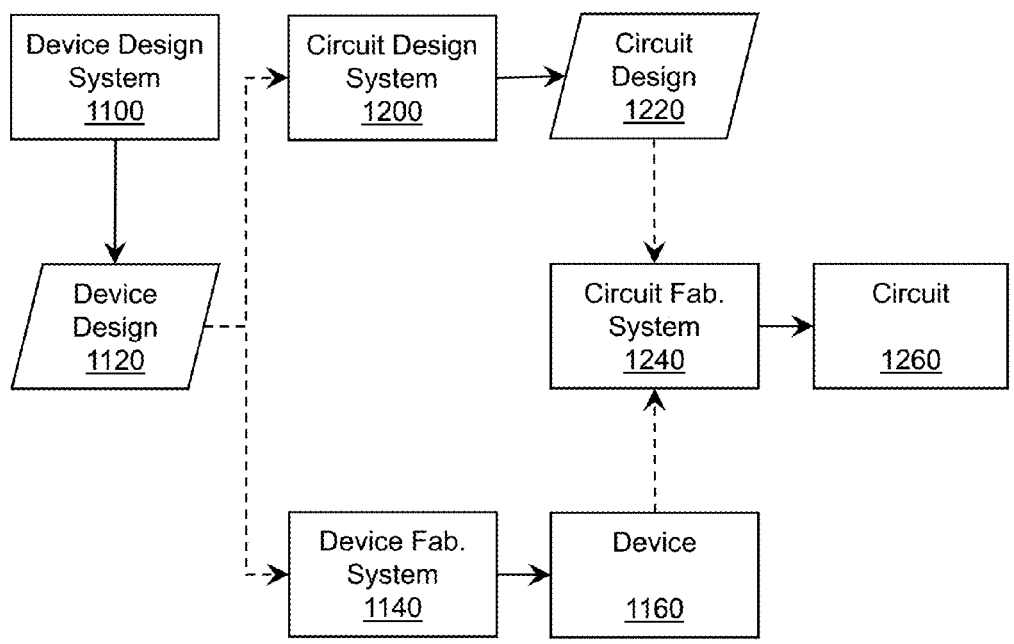
FIG. 20 shows an illustrative flow diagram for fabricating a circuit that comprises a SSLS with an integrated FET modulator and pulse driver according to one of the various embodiments described herein.

In one embodiment, the invention provides a method of designing and/or fabricating a circuit that includes one or more of the devices designed and fabricated as described herein. To this extent, FIG. 20 shows an illustrative flow diagram for fabricating a circuit 1260 according to an embodiment. Initially, a user can utilize a device design system 1100 to generate a device design 1120 for a semiconductor device as described herein. The device design 1120 can comprise program code, which can be used by a device fabrication system 1140 to generate a set of physical devices 1160 according to the features defined by the device design 1120. Similarly, the device design 1120 can be provided to a circuit design system 1200 (e.g., as an available component for use in circuits), which a user can utilize to generate a circuit design 1220 (e.g., by connecting one or more inputs and outputs to various devices included in a circuit). The circuit design 1220 can comprise program code that includes a device designed as described herein. In any event, the circuit design 1220 and/or one or more physical devices 1160 can be provided to a circuit fabrication system 1240, which can generate a physical circuit 1260 according to the circuit design 1220. The physical circuit 1260 can include one or more devices 1160 designed as described herein.

In another embodiment, the invention provides a device design system 1100 for designing and/or a device fabrication system 1140 for fabricating a semiconductor device 1160 as described herein. In this case, the system 1100, 1140 can comprise a general purpose computing device, which is programmed to implement a method of designing and/or fabricating the semiconductor device 1160 as described herein. Similarly, an embodiment of the invention provides a circuit design system 1200 for designing and/or a circuit fabrication system 1240 for fabricating a circuit 1260 that includes at least one device 1160 designed and/or fabricated as described herein. In this case, the system 1200, 1240 can comprise a general purpose computing device, which is programmed to implement a method of designing and/or fabricating the circuit 1260 including at least one semiconductor device 1160 as described herein. In either case, the corresponding fabrication system 1140, 1240, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1100 to generate the device design 1120 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1100 for designing and/or a device fabrication system 1140 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
   a solid-state lighting source (SSLS) including an active p-n junction region for electron-hole pair recombination and light emission therefrom, the active p-n junction region including: a n-type semiconductor layer; a p-type semiconductor layer; and a light generating structure formed between the n-type semiconductor layer and the p-type semiconductor layer;
   a pair of current supply electrodes, wherein one of the current supply electrodes is formed over the p-type semiconductor layer and another of the current supply electrodes is formed over the n-type semiconductor layer;
   an SSLS access region formed within the SSLS that provides access to the active p-n junction region;
   a field-effect transistor (FET) modulator having a drain region, a gate electrode, and a source electrode integrated in the SSLS access region between the active p-n junction region and one of the current supply electrodes; and
   a modulation voltage source to supply a modulation voltage to the FET modulator, wherein the modulation voltage source is configured to supply voltage pulses having a pulse amplitude and polarity to turn on and off current flowing through the FET modulator, and wherein the voltage pulses have a pulse duration that is at least two times smaller than a thermal time constant of the SSLS.

2. The device of claim 1, wherein the FET modulator is formed on a bottom semiconductor layer of the active p-n junction region, wherein the source electrode is formed on one of the current supply electrodes, and the drain region occupies a portion of the SSLS access region including the bottom semiconductor layer, and wherein the bottom semiconductor includes the n-type semiconductor layer.

3. The device of claim 1, wherein the SSLS access region further comprises at least two diodes and a resistor formed therein, the diodes and the resistor electrically connected to one of the gate and source electrodes of the FET modulator and one of the current supply electrodes.

4. The device of claim 1, wherein the modulation voltage source comprises a pulse driver.

5. The device of claim 4, further comprising a substrate formed on a bottom semiconductor layer of the active p-n junction region, wherein the pulse driver is formed on the substrate on a surface opposite to the bottom semiconductor layer.

6. The device of claim 5, wherein the source electrode of the FET modulator extends through the substrate penetrating into the pulse driver.

7. The device of claim 5, further comprising a buffer layer formed on the substrate and a Bragg reflector mirror formed between the buffer layer and the bottom semiconductor layer.

8. The device of claim 1, wherein the modulation voltage source is coupled to the gate electrode of the FET modulator, the modulation voltage source configured to supply voltage pulses to the gate electrode.

9. A device, comprising:
   a solid-state lighting source (SSLS) including an active p-n junction region for electron-hole pair recombination and light emission therefrom, the active p-n junction region including: a n-type semiconductor layer; a p-type semiconductor layer; and a light generating structure formed between the n-type semiconductor layer and the p-type semiconductor layer;
   a pair of current supply electrodes, wherein one of the current supply electrodes is formed over the p-type semiconductor layer and another of the current supply electrodes is formed over the n-type semiconductor layer;
   a field-effect transistor (FET) modulator having a drain region, a gate electrode, and a source electrode formed over a top semiconductor layer of the SSLS; and
   a modulation voltage source to supply a modulation voltage to the FET modulator, wherein the modulation voltage source supplies voltage pulses to the gate electrode, the voltage pulses having a pulse amplitude and polarity to turn on and off current flowing through the FET modulator, wherein the voltage pulses have a pulse duration that is at least two times smaller than a thermal time constant of the SSLS.

10. The device of claim 9, further comprising a dielectric layer formed on the top semiconductor layer of the SSLS and a FET channel layer formed between the dielectric layer and the FET modulator, wherein the source electrode extends along a side surface of the FET channel layer and wraps around to extend along a first portion of a surface of the FET channel layer, the gate electrode formed over a portion of the source electrode, extending along the portion of the source electrode, and wrapping around a side of the source electrode to contact a second portion of the surface of the FET channel layer, and the drain region spaced apart from the source electrode and the gate electrode that contacts a third portion of the surface of the FET channel layer.

11. The device of claim 9, further comprising a substrate formed on a bottom semiconductor layer of the active p-n junction region, wherein an anode of the SSLS is formed from the top semiconductor layer and a cathode of the SSLS is formed on a backside of the substrate.

12. The device of claim 11, wherein the modulation voltage source comprises a pulse driver, and wherein the pulse driver is formed on the backside of the substrate.

13. The device of claim 12, wherein each of the current supply electrodes extends through the substrate penetrating into the pulse driver, wherein one current supply electrode extends from the anode to the pulse driver and the other current supply electrode extends from the cathode to the pulse driver.

14. The device of claim 13, further comprising at least one active p-n junction dielectric layer separating one of the anode and the cathode of the SSLS from a side portion of the active p-n junction region.

15. A device, comprising:
   a solid-state light source (SSLS) structure including an array of SSLSs, each of the SSLSs including an active p-n junction region for electron-hole pair recombination and light emission therefrom, the active p-n junction region including: a n-type semiconductor layer; a p-type semiconductor layer; and a light generating structure formed between the n-type semiconductor layer and the p-type semiconductor layer, and an integrated field-effect transistor (FET) modulator that modulates the SSLS; and
   a pulse driver integrated with the SSLS structure to control modulation of the array of SSLSs in the SSLS structure with the corresponding FET modulators, wherein the pulse driver is configured to supply voltage pulses having a pulse amplitude and polarity to turn on and off current flowing through the FET modulator, and wherein the voltage pulses have a pulse duration that is at least two times smaller than a thermal time constant of the SSLS.

16. The device of claim 15, further comprising a switch configured to couple the pulse driver with each of the SSLSs in the array of SSLSs, wherein the switch is configured to connect the SSLSs in a circular manner, wherein a first pulse generated from the pulse driver is directed to a first SSLS in the array of SSLSs and each subsequent pulse generated from the pulse driver is directed to a next SSLS in the array of SSLSs.

17. The device of claim 16, wherein the switch includes a switch time delay corresponding to a pulse duration of the pulses generated from the pulse driver, wherein the pulses generated from the pulse driver to the SSLSs overlap as a function of the switch time delay.

18. The device of claim 15, wherein the pulse driver drives the array of SSLSs to a quasi-continuous wave modulation optical output.

19. The device of claim 15, wherein the array of SSLSs is configured to generate a predetermined radiation intensity during a target duration, wherein the pulse driver turns on selected SSLSs at a specified duration resulting in the array of SSLSs generating a flash pulse having a predetermined beam shape and width.

20. The device of claim 15, further comprising an optical lens to reconfigure a shape and width of a beam generated from the array of SSLSs.

* * * * *